United States Patent [19]
Gevelber et al.

[11] Patent Number: 6,162,488
[45] Date of Patent: Dec. 19, 2000

[54] METHOD FOR CLOSED LOOP CONTROL OF CHEMICAL VAPOR DEPOSITION PROCESS

[75] Inventors: Michael A. Gevelber, Auburndale; Manuel Toledo-Quinones, Boston, both of Mass.

[73] Assignee: Boston University, Boston, Mass.

[21] Appl. No.: 08/856,119

[22] Filed: May 14, 1997

Related U.S. Application Data

[60] Provisional application No. 60/017,399, May 14, 1996.

[51] Int. Cl.[7] .................................................. C23C 16/52
[52] U.S. Cl. .............................. 427/8; 427/9; 427/248.1
[58] Field of Search ............................... 427/248.1, 585, 427/586, 8, 9

[56] References Cited

U.S. PATENT DOCUMENTS

| | | | |
|---|---|---|---|
| 4,388,342 | 6/1983 | Suzuki et al. | 427/8 |
| 4,857,278 | 8/1989 | Gevelber et al. | 117/954 |
| 4,859,493 | 8/1989 | Lemelson . | |
| 5,009,485 | 4/1991 | Hall | 427/255.2 |
| 5,064,684 | 11/1991 | Mir et al. . | |
| 5,069,928 | 12/1991 | Echizen et al. . | |
| 5,082,517 | 1/1992 | Moslehi . | |
| 5,091,320 | 2/1992 | Aspnes et al. | 427/8 |
| 5,104,684 | 4/1992 | Tao et al. . | |
| 5,131,752 | 7/1992 | Yu et al. | 427/10 |
| 5,156,820 | 10/1992 | Wong et al. . | |
| 5,221,414 | 6/1993 | Langley et al. . | |
| 5,352,487 | 10/1994 | Klinedinst et al. | 427/248.1 |
| 5,360,549 | 11/1994 | Mouche et al. . | |
| 5,360,594 | 11/1994 | Meijer . | |
| 5,387,288 | 2/1995 | Shatas . | |
| 5,428,527 | 6/1995 | Niemi . | |
| 5,446,825 | 8/1995 | Moslehi et al. . | |
| 5,458,086 | 10/1995 | Smith et al. . | |
| 5,536,317 | 7/1996 | Crain et al. | 427/255.6 |
| 5,786,023 | 7/1998 | Maxwell et al. | 427/8 |

OTHER PUBLICATIONS

Toledo–Quiñones et al., "Lumped Modelling and Analysis of CVD Mass Transport and Chemical Reaction Dynamics," *ASME*, vol. 259, (1993): 93–100.

*Primary Examiner*—Shrive Beck
*Assistant Examiner*—Bret Chen
*Attorney, Agent, or Firm*—Samuels, Gauthier & Stevens, LLP

[57] ABSTRACT

The present invention is directed to a method of controlling the application of a surface coating by chemical deposition using a closed loop control on growth rate. The method compares a measure of growth rate against a setpoint for the growth rate and adjusts a primary input parameter in order to drive/maintain the measure of growth rate equal to the setpoint.

14 Claims, 15 Drawing Sheets

METHOD FOR CLOSED LOOP CONTROL OF CHEMICAL VAPOR DEPOSITION PROCESS

This application claims benefit of provisional application 60/017,399, May 14, 1996.

BACKGROUND

1. Field of the Invention

This invention is concerned with chemical vapor deposition processes (CVD) and methods for controlling them. In particular, this invention provides methods for real-time control of the production of a surface coating by deposition from a gaseous phase, through feedback control of the inputs to the production environment.

2. Review of Related Art

Surface modification technologies, by virtue of their ability to tailor the surface properties, have become an important part of materials development. Some of the critical properties that can be engineered by design of the coating morphology and composition include thermal shock resistance, corrosion, wear, and oxidation resistance. Chemical vapor deposition (CVD) has several characteristics that often make it a preferred, and sometimes the only coating method for depositing desired films. CVD is noted for its ability to produce dense coatings from a wide variety of materials, and unlike line-of-sight deposition methods, CVD can produce highly conformal films of uniform thickness on substrates with complex shapes.

The advantages of CVD may be largely offset by the difficulty in developing a set of deposition parameters to reliably deposit films or fabricate components in a manufacturing environment. This is particularly true since, as application requirements become increasingly demanding, several properties—often competing—are required of the coating system. The ability to utilize a monolithic coating may be limited, and novel engineered structures involving multi-layers and multiphases, while potentially providing novel composite materials, are more difficult to manufacture.

To develop a new coating, a research scale reactor is typically used to develop the coating, based on previous processing knowledge and empirical experimentation. Even for relatively simple CVD coatings such as a single component film, a relatively long development time is required. An experimental design for optimization of even a few film variables, such as grain size and film thickness uniformity, leads to a large test matrix and as a result an extensive research period. Scaling-up of the process to a production scale reactor requires a second level of development. Additional time is required to meet the design changes that occur during development of any new product.

Currently, CVD processes are essentially run in a feed-forward manner where feedback is used only to maintain specific values of inputs such as flow rates and pressure, but no feedback of in-situ measurements of the growth process is used. Thus, the selection of processing parameters (i.e. input settings such as gas flow rates and temperatures) to achieve materials objectives (e.g. composition and morphology), and processing objectives (e.g. coating layer thickness, growth rate, yield, and reproducibility) have been developed based on previous processing knowledge and empirical experimentation. The difficulty in using such an approach in developing new coatings is the inherent complexity of the process, in part because the process occurs by reaction paths where important constants, such as the kinetic coefficients, are not known.

Despite its importance and versatility in the deposition of a variety of thin films, significant limitations in developing a generalized understanding of CVD remain. Conventional operation of the process focuses on trial-and-error experiments, guided by insight obtained from extensive scientific and modeling studies that have been performed. The extension of these empirical results to different reactor configurations and to new coatings is generally difficult. Many studies have been aimed at achieving a fundamental understanding of the process and at relating operational conditions—such as pressure, temperature, gas flows and reactor geometry—to performance measures like uniformity, deposition rate, composition and micro structure. Previous work can be classified into three major areas: experimental investigation of the reaction kinetics and coating structures, development of sensors (primarily for diagnostics), and modeling.

Numerous models have been used to obtain insight into the complex nature of CVD. Due to the large computational effort involved in a detailed solution of all relevant equations, many of the proposed models emphasize a particular aspect of CVD. Numerical methods are applied to solve the coupled equations, and they use large numbers of nodes to simulate the process. This is required to capture the coupled nature of the thermal-fluid distribution, chemical reactions, and surface physics.

Early modeling work focused on one-dimensional models that captured the thermal fluid nature of the process. While some of this work focused in analytical solutions and insight (such as that by Giling (de Croon, et al., (1990) *J. Electrochem. Soc.*, 137(9), and Spear (1982) *Pure and Applied Chemistry* 54(7):1297–1312) it became more complex (i.e. capturing the two- and three-dimensional nature of the process) as computer-based numerical approaches became standard (for example Wahl (1983) *Proceedings of the Fourth European Conference on CVD*; Wahl (1983) *Proceedings of the Ninth International Conference on CVD*; Wahl (1983) *Proceedings of the Fifth European Conference on CVD*); Jensen, et al., (1983) *J. Electrochem. Soc.,* 139(1); Fotiadis, et al., (1990) *J. of Cryst. Growth,* 100:577–599; and Jensen (1989) *Advan. Chem. Ser.,* 221).

Giling (1990) has articulated a number of the important fluid-thermal phenomena that must be considered in both hot and cold wall reactors. Important issues include laminar/turbulent flow regimes, free convection effects in cold wall reactors, entrance effects, multicomponent diffusivity, boundary layer thickness considerations, and implications for reactor design. This analysis was confirmed by holographic measurements of the temperature and flow distributions.

Spear(1982) focused on developing models that capture mass transport and reactions near the substrate surface. He took into account diffusion of multiple species through the boundary layer, adsorption and reactions. He also pioneered the use of thermodynamic models of steady state CVD reactions, which provide useful insight into the equilibrium phenomena of the CVD process. Thermodynamic studies are important because they provide insight into possible gas phase and surface reactions, but do not take into consideration kinetic limitations that can significantly affect the process.

Wahl (1983) was one of the authors that began to develop more complete representations of the entire process. He focused on the laminar flow regime and on the deposition of $SiO_2$. A two-dimensional representation of an axisymetric furnace was used to solve the coupled Navier-Stoke equations and multicomponent chemical reactions in both the gas and surface. For a simple reactor this involved a 400-element grid which determined the steady state flow, concentration and deposition rates.

Kalidindi, et al. (April, 1991) *J. Electrochem. Soc.,* 138 (4), utilized a Bond Graph approach, which is a lumped parameter and control volume modeling method. They specifically modeled the pyrolysis of tetraethoxysilane for deposition of $SiO_2$. This modeling approach yields a set of ordinary differential equations which is shown to adequately describe the one-dimensional nature of the reactor diffusion, convection, gas flow and surface reactions. They have only considered the steady-state characteristics of the process.

Extensive work has been done by Jensen and coworkers to study the coupling between physical and chemical phenomena for many realistic reactor conditions. An investigation of flow and heat transfer phenomena was performed by Fotiadis et. al., (1990) using a 50,000 node finite element model (FEM) to solve the momentum, continuity and energy equations. A similar study done by Chehouani and coworkers (Chehouani, et al., (1991) *Journal de Physique IV, Colloque C2, suppl. au Journal de Physique II,* 1), focused on the pyrolysis of carbon on inductively-heated graphite substrates and used a 2635-node FEM to-establish the influence of operational parameters on the temperature and velocity fields. Ulacia et. al. (1989) *Applied Surface Science,* 38:370–385, solved the mass-, chemical-species-, momentum-, and energy-continuity equations using a finite volume scheme and several thousand nodes. These authors calculated three-dimensional contours for flow, temperature, pressure, concentrations for various chemical species and deposition rate as a function of process parameters. Arora, et al., (1991) *Journal of the Electrochemical Society,* 138(5), focused their attention on the surface mechanisms present in the low-pressure deposition of tungsten and included detailed calculations on 65 elementary surface processes in their models.

All these studies have been concerned with steady state aspects of the process. Although Wessbecher, et al., (1992) *Thin Solid Films,* 207:57–64, focused their attention on non-steady state aspects of simplified reaction kinetics that yield limit cycles, no work that identifies the fundamental dynamics of the entire process has been reported. While the potential of feedback control of CVD has been recognized by Bonnot, et al., (1992) *Elsevier Science Publishers B.V.,* Amsterdam, and by Sheldon, et al., (1991) *Mat. Res. Soc. Symp. Proc.,* Vol. 202, pp. 161–166, these researchers have focused their efforts on the development of in-situ probes and not on the fundamental issues related to developing an appropriate control system.

A number of authors have focused on the development of in-situ sensors. While much of this work is aimed at developing better diagnostic tools, it does provide the basis for developing real-time sensors for feedback control. Important variables that can be fairly easily sensed include temperature (by either thermocouple or optical pyrometry), gas species presence (by mass spectroscopy), and growth rate. More complicated is to resolve the competition between nucleation and growth. Sheldon, et al. (1990) *Mat. Res. Soc. Symp. Proc.,* Vol. 168, have recently utilized light scattering to infer surface roughness, which is expected to be related to the current state of the micro-structure. Their experimental apparatus includes a HeNe 5 mW laser and a linear array of 1024 photo-diodes. The difficulty of this measurement is twofold: experimental difficulties and interpretation of the scattering signal. While some quantitative characterization has been demonstrated for ex-situ measurements, the in-situ measurement is more difficult due to radiation from the substrate. Interpretation of even ex-situ measurements, however, is limited due to the need to assume a model for nucleation/growth and assumptions needed to make the scattering analysis tractable (i.e. that the surface is gaussian). It is known, however, that only in the early stages of growth on a smooth surface are these assumptions valid.

Process development times could be greatly compressed if the CVD process could be controlled with sufficient accuracy to predict deposition thickness profiles on complex shapes, but current theoretical understanding does not support such predictions. In addition, it is difficult to maximize growth rates while maintaining structural integrity (i.e. maintaining desired composition and microstructure). Solutions to these problems are still being sought.

SUMMARY OF THE INVENTION

It is an object of this invention to provide a method for controlling application of a coating onto a substrate by chemical vapor deposition which uses a minimum of control parameters and is relatively insensitive to inaccuracies in the model of the CVD process used to design the reactor and control structure.

It is another object of this invention to provide a method for controlling CVD processes which facilitates adapting the process to different reactors (e.g., scale-up), and maximizes growth rates while maintaining structural integrity of the coating.

It is yet another object of this invention to provide control structures which control growth rate (which can be related to coating thickness), as well as the microstructure and composition of the evolving coating.

These and other objects are met by one or more of the embodiments of this invention, which provide methods for controlling the application of a surface coating to a substrate by chemical deposition from a gaseous phase, in a reaction chamber containing the gaseous phase.

In one embodiment, this invention provides a method for controlling the application of a surface coating which includes a primary control loop comprising comparing a measurement of growth rate of the surface coating to a preselected setpoint for desired growth rate of the surface coating to determine a growth rate error signal, determining a primary corrective input signal from the growth rate error signal, and adjusting a primary input parameter based on the primary corrective input signal, the primary input parameter being selected from the group consisting of mass flow rate into the reaction chamber of a component in the gaseous phase, total mass flow rate into the reaction chamber, total pressure in the reaction chamber, heating power input into the reaction chamber, intensity of radiation input into the reaction chamber, and energy level of radiation input into the reaction chamber. In one embodiment of the method for controlling the application of a surface coating to a substrate by chemical deposition, where the primary input parameter is mass flow rate into the reaction chamber of a component in the gaseous phase, the gaseous phase also contains a ballast gas, and total mass flow rate into the reaction chamber is maintained by equal and opposite adjustment of the mass flow rate of the ballast gas to compensate for adjustment in the primary input parameter.

In a preferred embodiment, the method including a primary control loop for controlling the application of a surface coating to a substrate by chemical deposition according to this invention also includes a second control loop comprising comparing a measurement of temperature of the surface coating to a preselected setpoint for temperature of the surface coating to determine a surface temperature error signal, determining a second corrective input signal from the surface temperature error signal, and adjusting a second input parameter based on the second corrective input signal, the second input parameter being selected from the same group of input parameters, but with the second input parameter being different from the primary input parameter. Preferably, the second input parameter is heating power input into the reaction chamber; more preferably, heating power is power applied to a resistance heater or power applied to an induction heater. In an alternative embodiment of the method for controlling the application of a surface coating to a substrate by chemical deposition according the preferred embodiment, either the primary input parameter or the second input parameter is intensity of radiation input into the reaction chamber or energy level of radiation input into the reaction chamber, the radiation input being optionally supplied by a laser beam directed into the reaction chamber.

In a particularly preferred embodiment of the method for controlling the application of a surface coating to a substrate by chemical deposition according to this invention, the primary input parameter and the second input parameter are selected so that the primary input parameter has the largest value among the listed parameters for ratio of growth rate gain to time constant for changes in growth rate of the surface coating in response to an equal fractional change in each listed input parameter among all listed input parameters, and the second input parameter has the largest value among the listed parameters other than the primary input parameter for ratio of temperature gain to time constant for change in temperature of the surface coating in response to an equal fractional change in each listed input parameter among all listed input parameters other than the primary input parameter.

In another particularly preferred embodiment of the method for controlling the application of a surface coating to a substrate by chemical deposition according to this invention, the method includes a third control loop comprising comparing a measurement of coating microstructure to a preselected setpoint for measurement of coating microstructure to determine a microstructure error signal, determining a third corrective input signal from the microstructure error signal, and adjusting the preselected setpoint for desired growth rate of the surface coating and the preselected setpoint for temperature of the surface coating based on the third corrective input signal.

In another preferred embodiment of the method for controlling the application of a surface coating to a substrate by chemical deposition according to this invention, the method includes two coupled control loops, the first control loop comprising comparing a measurement of growth rate of the surface coating to a preselected setpoint for desired growth rate of the surface coating to determine a growth rate error signal and adjusting a first input parameter based on a first corrective input signal, and the second control loop comparing a measurement of temperature of the surface coating to a preselected setpoint for temperature of the surface coating to determine a surface temperature error signal and adjusting a second input parameter based on a second corrective input signal, the first corrective input signal and the second corrective input signal each being determined from both the growth rate error signal and the surface temperature error signal, where the first input parameter and the second input parameter are different from each other and each is selected from the group consisting of mass flow rate into the reaction chamber of a component in the gaseous phase, total mass flow rate into the reaction chamber, total pressure in the reaction chamber, heating power input into the reaction chamber, intensity of radiation input into the reaction chamber, and energy level of radiation input into the reaction chamber. Typically, the first and second input parameters are selected so that the first input parameter has the largest value among the listed parameters for ratio of growth rate gain to time constant for change in growth rate of the surface coating in response to an equal fractional change in each listed input parameter among all listed input parameters, and the second input parameter has the largest value amoung the listed parameters other than the first input parameter for ratio of temperature gain to time constant for change in temperature of the surface coating in response to an equal fractional change in each listed input parameter among all listed input parameters other than the first input parameter. Preferably, the second input parameter is heating power input into the reaction chamber; more preferably, heating power is power applied to a resistance heater or power applied to an induction heater. Alternatively, either the first input parameter or the second input parameter is intensity of radiation input into the reaction chamber or energy level of radiation input into the reaction chamber, the radiation being optionally supplied by a laser beam directed into the reaction chamber.

In a particularly preferred embodiment of the method for controlling the application of a surface coating to a substrate by chemical deposition using coupled control loops, the method includes a third control loop comprising comparing a measurement of coating microstructure to a preselected setpoint for measurement of coating microstructure to determine a microstructure error signal, determining a third corrective input signal from the microstructure error signal; and adjusting the preselected setpoint for desired growth rate of the surface coating and the preselected setpoint for temperature of the surface coating based on the third corrective input signal.

In yet another embodiment, this invention provides a method for applying a surface coating to a substrate by chemical deposition from a gaseous phase, where the chemical deposition is controlled by comparing a measurement of growth rate of the surface coating to a preselected setpoint for desired growth rate of the surface coating to determine a growth rate error signal; determining a primary corrective input signal from the growth rate error signal; and adjusting a primary input parameter based on the primary corrective input signal, the primary input parameter being selected from the group consisting of mass flow rate into the reaction chamber of a component in the gaseous phase, total mass flow rate into the reaction chamber, total pressure in the reaction chamber, heating power input into the reaction chamber, intensity of radiation input into the reaction chamber, and energy level of radiation input into the reaction chamber, the method includes monitoring of the thickness of the coating as it is being deposited, and mass flow rate into the reaction chamber of at least one component of the gaseous phase is varied in response to the thickness of the coating. Consequently, the composition of the resultant coating changes with depth of the coating.

In still another embodiment, this invention provides a system for controlling the application of a surface coating to a substrate by chemical deposition from a gaseous phase, made up of a plurality of local feedback control loops, each local feedback control loop comprising means for comparing a measurement of growth rate of the surface coating in a local area to a preselected setpoint for desired growth rate of the surface coating to determine a local growth rate error signal; means for determining a local primary corrective input signal from the local growth rate error signal; and means for adjusting a local primary input parameter based on the local primary corrective input signal, the local primary input parameter being selected from the group consisting of local mass flow rate a component in the gaseous phase, local flow rate of total mass in the reaction chamber, heating power directed to the local surface, and local intensity of radiation energy. This control system allows for compensation to reflect local variation in temperature, gas composition or other factors that cause local deviation from the average coating growth rate in the reaction chamber.

The control methods of this invention are based on in-situ measurement of the actual coating being grown in real-time and as such, they are applicable to a variety of different coating structures. The importance of a measurement-based feedback system is that it can enhance the ability to achieve desired coating microstructure, compensate for process variations (disturbances) and improve the capability of transferring process recipes to different systems. These methods obviate time and effort required under the current practice to empirically develop process "recipes" (i.e. specifications for the various mass flow rates, temperature, and pressure) that achieve the desired coating characteristics. An additional benefit of the new control system is that it enables quicker development of processes for manufacture of new coatings.

DETAILED DESCRIPTION OF THE EMBODIMENTS

Control Theory

Figure 1:
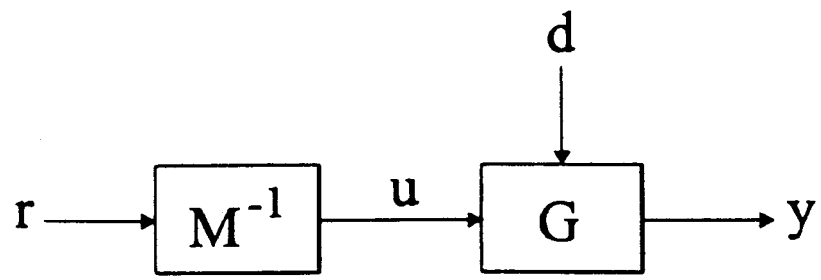
FIG. 1 shows a generalized feedforward control system in schematic representation.

Control theory provides a useful framework and tools for improving materials processing capabilities by providing a basis for integrating the modeling, system design, and control development efforts. One can view all systems as being controlled in one of, or combinations of, two manners: open and closed loop. Open-loop, or feedforward control (FIG. 1), uses either empirical or model-derived input signals to drive the plant. The input(s) u required to achieve the process objectives(s) r must be pre-determined, either by an operator, or, by a model $M^{-1}$. Much of the innovation in CVD technology has been directed to improving the control mechanisms for accurately maintaining the level of the input u, typically by better design of the actuators. The achievable performance, however, is limited, since there is no compensation for model errors, changes in the plant, or other disturbances.

Figure 2:
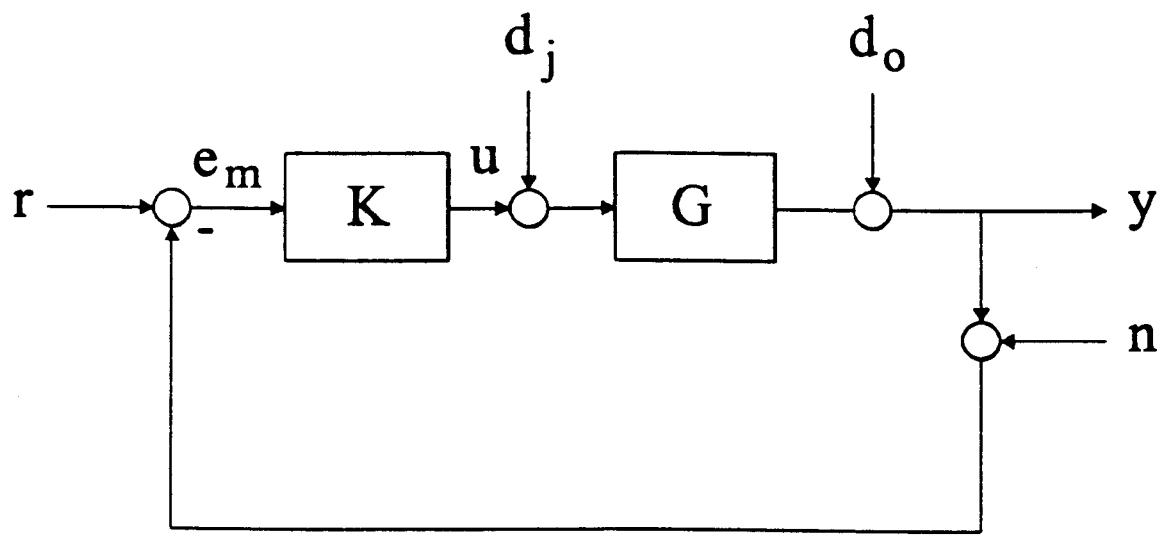
FIG. 2 shows a generalized feedback control system in schematic representation.

Feedback structures (FIG. 2), compare a measurement of system output y to the desired output (command signal) r to determine error $e_m$. Measured error $e_m$ is the difference r−y+n, where n is sensor noise. Error $e_m$ is used by controller K to determine the corrective input signal u that compensates for errors. G is the transfer function which maps input value to output value. Factors that cause errors can be classified as either disturbances $d_i$, $d_o$ (such as disturbances due to uncontrolled variations in external inputs to the system) or variations in the plant (not shown). Feedback control can (a) allow the system to take corrective action in the event of a process variation or disturbance d, (b) be used to automatically determine an operating regime (i.e. appropriate selection of input settings) that achieves the desired outputs (i.e. follow command signals r), and (c) provide the ability to correct for changes in the system and in modeling errors. The control design process for feedback control can be divided into two steps. First, the appropriate control structure must be identified (i.e. which inputs and measurements should be used to implement the control system). Second, a suitable control algorithm (i.e. the relation that determines system input settings based on the measured error) must be implemented. Analysis of the process's dynamic features is used in the determination of answers to these questions.

Processes where it is desired to simultaneously control several degrees of freedom (referred to as multiple-input-multiple-output (MIMO) control problems) can pose significant difficulties in achieving desired performance objectives. A significant difficulty occurs when the plant structure results in directional sensitivities of the output due to the cross coupling within the plant (i.e. each input affects more than one of the outputs). This situation is indicated when the plant's transfer matrix has a large condition number. When the condition number is large, the performance-robustness can be severely limited for both feedforward and feedback control. The traditional point of departure for control design and analysis is after the choice of inputs and outputs have been made. In many cases, however, the performance can be improved by choice of more effective actuators (and the inputs which they control), measurements, and/or control structure; in extreme cases, redesign of the system may also be indicated.

Designing the control structure entails two related activities. First, the designer needs to select a set of inputs and outputs used for the system control, and secondly, the internal relations of these inputs and outputs (i.e., the grouping and possible decoupling of blocks of inputs and outputs) are considered. For both these activities, it is desirable to gain insight into the process physics and coupling of inputs, internal states, and outputs. A recently proposed matrix decomposition approach can be used to overcome the limitations of the singular value decomposition (SVD) and relative gain array (RGA) analyses (Gevelber (Dec. 1989) *ASME DSC* Vol. 18, p. 123). The inventors have applied the above principles of control theory to CVD processes and developed novel control structures which are surprisingly simple, yet provide significant enhancement in control of coating uniformity and quality.

Control of chemical vapor deposition processes

A variety of processes are available to modify the surface of a solid component by changing the chemical compositon at the surface. Chemical vapor deposition (CVD) is one of these processes, and it modifies a surface by coating the surface with a film made up of material which is deposited from a gaseous phase. A substrate in the reaction chamber is coated with material deposited from the gaseous phase as a result of chemical reaction between the reactants in the vapor or between the vapor phase reactants and the surface of the substrate itself.

Key elements of CVD processes include a gaseous phase containing one or more reactants for the chemical reaction that produces the coating layer, a reaction chamber which contains the gaseous phase, and some method for inputting energy to maintain the reactants in the gaseous phase and/or drive the reaction. Energy may be supplied to the reactants in the reaction chamber in various forms, depending on which CVD system is in use. In conventional CVD, the reaction chamber (and the enclosed gas) is heated by resistance heaters or the substrate may be heated directly by induction heating. Alternatively, energy may be supplied directly to the gaseous phase by microwaves to convert the gaseous phase to a plasma. In other alternatives, lasers may be used for direct local heating of the substrate or energy may be supplied in ion beams.

Both phenomenological and mechanistic descriptions of the process indicate that controlling substrate temperature and the rate at which the coating grows (i.e., is deposited on the surface) are determining factors in controlling the composition and microstructure of the resulting coating. The specific mechanisms relating the controlled variables to the micro-structure are largely determined by conditions that are specific to the substrate/coating system. Nevertheless, concepts from nucleation and growth theories are used in the interpretation of the experimental results and are applicable to CVD. In general, the micro-structure is determined by the interplay of three different factors:

(1) rate of production of particles by the chemical reaction, (2) probability of growth of embryos into stable clusters (i.e. nucleation), and (3) migration of particles on the surface.

The micro-structure can be viewed as fundamentally determined by a "balance" between the above mechanisms and the energetics of the specific material. At high temperatures and low rates of production, the surface mobility is high and the particles bond to the most energetically favorable places in the surface, such as steps and other special sites. These conditions often favor single crystal or columnar growth. At higher production rates, the probability for particles to form bonds before reaching such sites increases, and the formation of polycrystalline films becomes likely. At low temperatures, the low mobility of the particles causes their attachment at random positions and increase the likelihood of amorphous films. Mobility is mainly determined by the surface temperature, which in turn is affected by the reactor's temperature, the heat transfer in the chamber and the characteristics of the chemical reaction. The production rate is affected by these factors, but will also depend on the partial pressures plus total flow and total pressure used in the process.

This is a highly simplified description of the process. Cluster and reactant surface diffusion, which have been neglected, are possible under the conditions of CVD. Furthermore, the presence of reactants and byproducts in the surface may have large effects on the above mechanisms. However, despite the possibility that process might be distorted by such complex interactions, the above description appears sufficient to encompass the experimental observations in many different CVD systems.

Control of CVD according to this invention may function through control of the energy input to the reactants in the reaction chamber by heat input, microwave power or laser intensity, as well as control of the concentration of one or more of the reactants (e.g., through partial pressure of each reactant in the gaseous phase and/or total mass input into the reaction chamber and/or total pressure in the gaseous phase). The present invention offers a method to analyze CVD systems thereby providing the basis for selecting inputs and outputs for the control system (i.e. the control structure design) and also provides information for re-designing the control system in order to minimize the condition number of the overall system. Requirements for obtaining a low condition number have been examined by the inventor, revealing the required characteristics to achieve good performance and providing an indication of the relative performance of individual inputs and outputs. As a result, the control method according to this invention provides for a control system of low condition number to provide enhanced control of CVD processes based on one, two or three control loops, with greatly improved product quality and potential for increased throughput.

Once the system and control structure design is completed, control algorithms can be developed that implement the controller. Control design techniques such as model-based control (Doyle, et al., (1981), *IEEE Trans. Autom. Control*, AC-26:4), and internal model control (Garcia, et al., (1982) *Process Design Develop.*, 21:308), can be used, based on a model of the process. Thus, the low order process models developed as part of this research can also be used as the basis for developing appropriate control algorithms.

Control based on direct measurement of output characteristics is much less sensitive to deficiencies in the model on which the control algorithm is based. This is achieved by comparison of these measurements to desired output characteristics during the process with appropriate correction in real time. Thus, while use of algorithms which more accurately reflect the underlying physical system improves the final result, the feedback control system of this invention is superior to conventional feedforward control of CVD, no matter what control algorithm is used.

Major control objectives of this invention are: the design of a closed-loop control structure for growth rate, and independent closed-loop control based on variables more directly related to microstructure (i.e. growth rate and temperature). These objectives are addressed sequentially below.

Control structure based on growth rate

Figure 3:
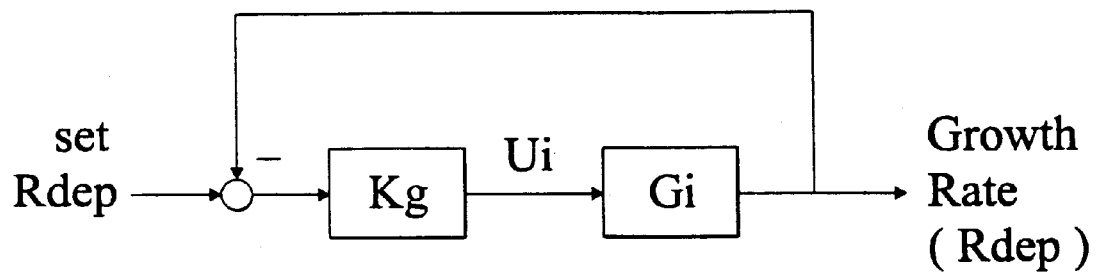
FIG. 3 is a schematic showing a control structure for closed-loop control of surface coating growth rate.

The most elementary control structure according to this invention is used to maintain a specified deposition rate, which is important for achieving a desired coating thickness and uniformity. FIG. 3 illustrates the basic control structure for real-time deposition rate control where $R_{dep,set}$ is the desired deposition rate, the measured output $R_{dep}$ is the actual growth rate of the coating, Gi is a transfer function which represents the physical process relating the specific input Ui to the output $R_{dep}$, and Kg is the control algorithm. The controller utilizes a real-time measurement of deposition rate (or coating thickness which can be differentiated to get deposition rate), and this information is then used to manipulate the most effective actuator for the particular case (which is dependent not only on the specific coating but also the type of operating regime, as described below).

The control structure in FIG. 3 enables real-time maintenance of a desired deposition rate. In many current CVD applications, the focus of coating development is only on a single coating composition and a specified thickness and uniformity. The control structure described in FIG. 3 offers significant advantages for such a process. The structure in FIG. 3 will also aid in the rapid scale-up of coatings developed in laboratory-scale machines to production units and in changing from one production reactor to another, or will enable rapid evolution of process recipes in response to changes in part configurations or coating specifications.

Control of deposition rate is also an important requirement for precise composition control of graded coatings (where the properties and composition of the coating are varied). Graded coatings are important where it is desirable to match the properties of the substrate to different end-use conditions. For example, to minimize the thermal stress, graded coating can be used to match the thermal expansion coefficient at the substrate-coating interface and then gradually change the thermal expansion coefficient through the coating to obtained the desired property of the protective coating.

Control structures with direct microstructure effects

For many applications, control of the micro-structure is critical in addition to control of coating uniformity. This adds constraints on which operating regime is desirable, in addition to those imposed by throughput and uniformity considerations. Prior to the present invention, such problems were resolved empirically. The present invention provides control structures that enhance the ability to control and maintain the desired microstructure in real time.

Figure 4:
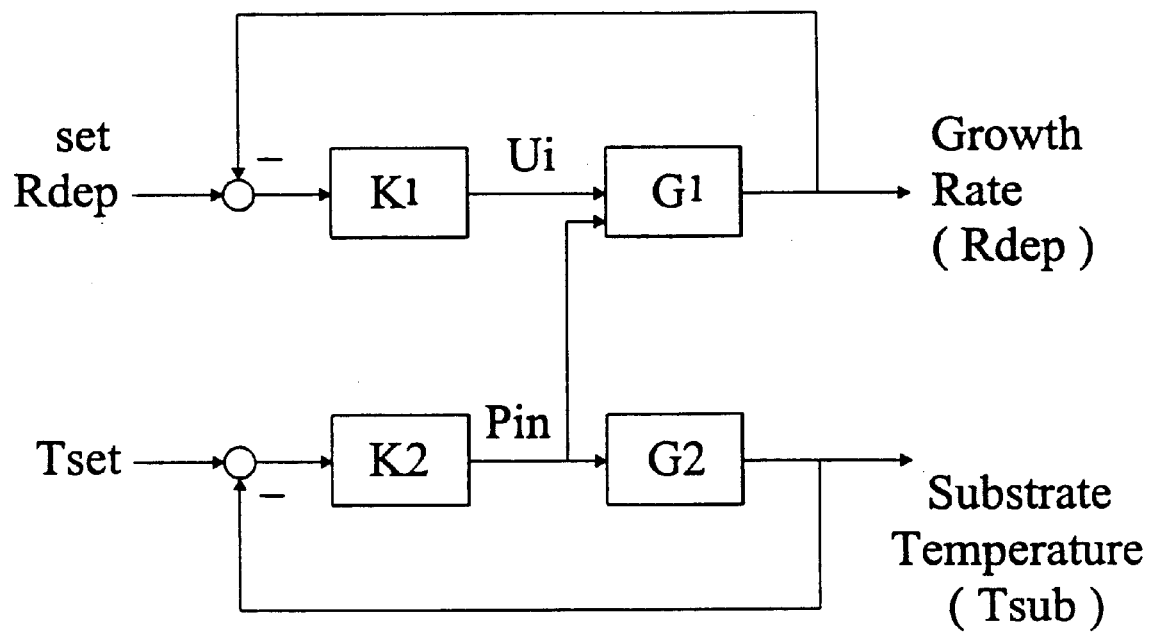
FIG. 4 is a schematic showing a decoupled control structure for closed-loop control based on coating growth rate and surface coating temperature, where these two degrees of freedom are intimately related to coating microstructure.

To summarize the theory and experimental observation, factors like the rate of production of a coating material and the surface temperature have been shown to have a strong influence on the micro-structure (Blocher (Aug. 1974) *J. Vac. Sci. Technol.*, 11(4): 680–686. The real-time control of such factors would provide a high degree of manipulation on the structure of the coating. Thus control structures also provided by this invention use direct measurement and control based on these two attributes of the growth rate for real time control of microstructure (see FIGS. 4 and 5). In FIG. 4, a decoupled control structure is used, i.e. there are separate decoupled control loops from each input to each of the two outputs. In this structure, each input is adjusted independently, so there are two control algorithms ($K_1$, $K_2$) and two inputs Ui and Pin are used to control the growth rate $R_{dep}$ in relation to $R_{dep,set}$, and substrate temperature $T_{sub}$ in relation to $T_{set}$ through transfer functions $G_1$ and $G_2$. The coupled control structure in FIG. 5 utilizes a more complex controller K that takes the coupling of the process (represented in coupled transfer function G) into consideration.

The structure of FIG. 4 is appropriate if the coupling between growth rate and temperature is such that it is predominantly unilateral (i.e., changing the temperature of the substrate will affect the deposition rate, but changing deposition rate will not significantly affect temperature). This can be determined experimentally and can be quantitatively analyzed using standard techniques like relative-gain-array. Unilateral coupling will occur if the growth rate is slow relative to the time constants of the dominant heat transfer modes and the amount of endo- or exothermic energy is small. Standard control loops such as PID can be used to tune the controller, or more advanced adaptive techniques can be used to overcome lack of process knowledge such as reaction kinetics. If the system behaves with bilateral coupling (FIG. 5), then a fully centralized control would need to be used. There are a number of design techniques that can be employed, such as internal model control to develop the actual control algorithm for a specific system.

Figure 5:
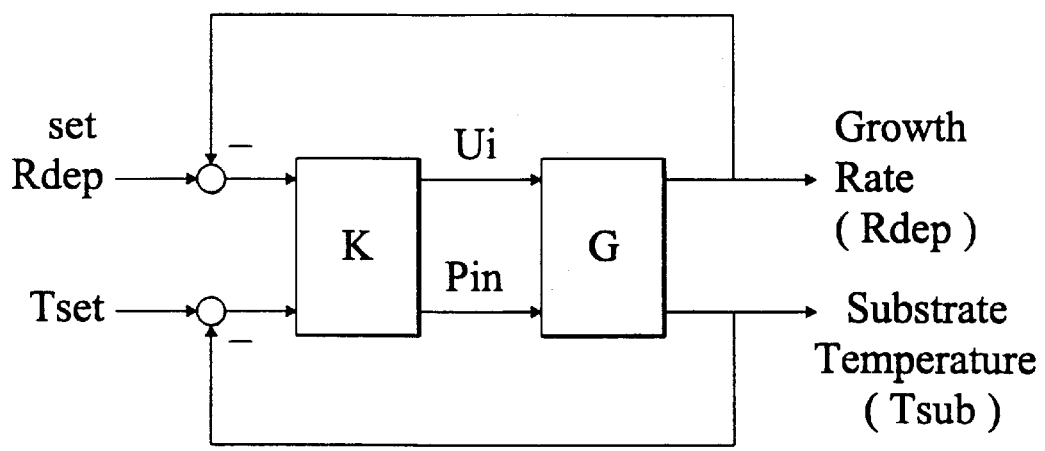
FIG. 5 is a schematic showing a coupled control structure for closed-loop control based on coating growth rate and surface coating temperature, where these two degrees of freedom are intimately related to the coating microstructure.

While the proposed control structures presented in FIGS. 4 and 5 do not directly achieve the objective of control based on realtime monitoring of microstructure, they do so indirectly. The primary benefit of these control structures is that they allow control of the factors that more directly determine the resulting coating microstructure. In contrast, an approach based only on monitoring and control of the actuator levels without regard to realtime results related to the state of the growth process itself while the coating is being deposited is an approach which regulates variables that are significantly removed from the factors that determine the resulting microstructure.

Figure 6:
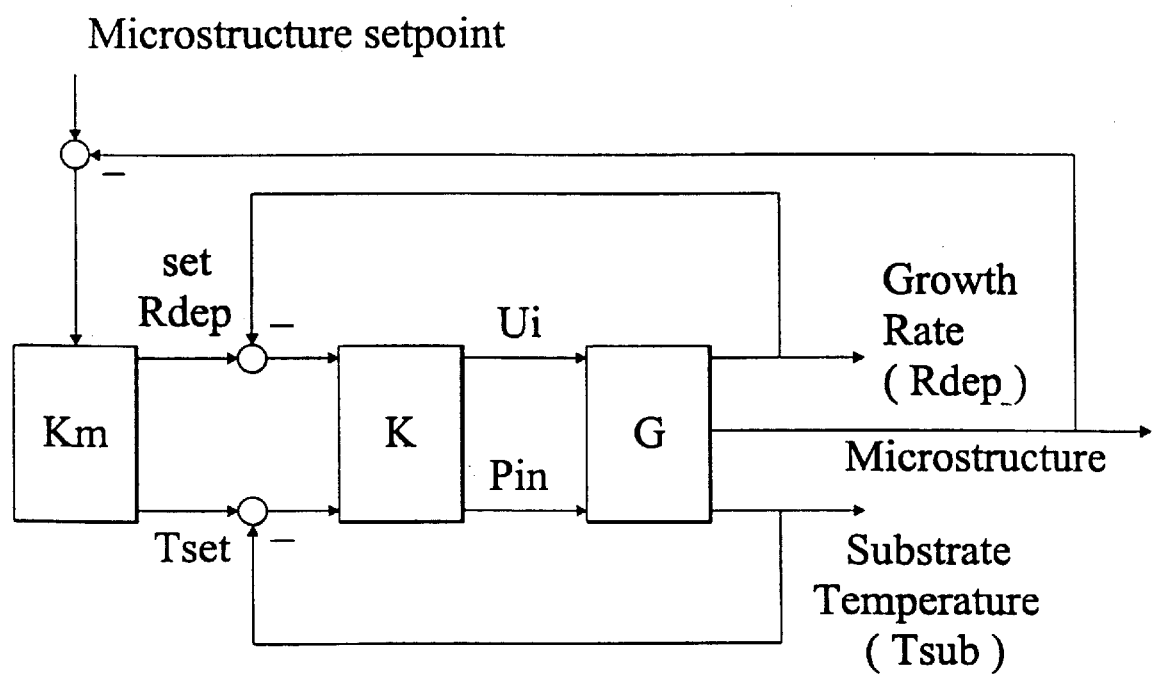
FIG. 6 is a schematic showing the control structure to ensure both coating uniformity and coating microstructure using closed-loop control based on growth rate, surface temperature and microstructure monitoring.

One may achieve more direct control of microstructure by feedback based on measurement of a characteristic of the surface coating (FIG. 6). In this embodiment, a cascaded control structure is employed, where the microstructure error is used to adjust the set points of the lower level controller(s) that were depicted in FIGS. 4 and 5. Here, the control algorithm Km adjusts the set-points of the inner loop(s) based on real time measurement of microstructure (or a real time signal from a surface condition that can be related to microstructure).

Control Structure Variations

Figure 7:
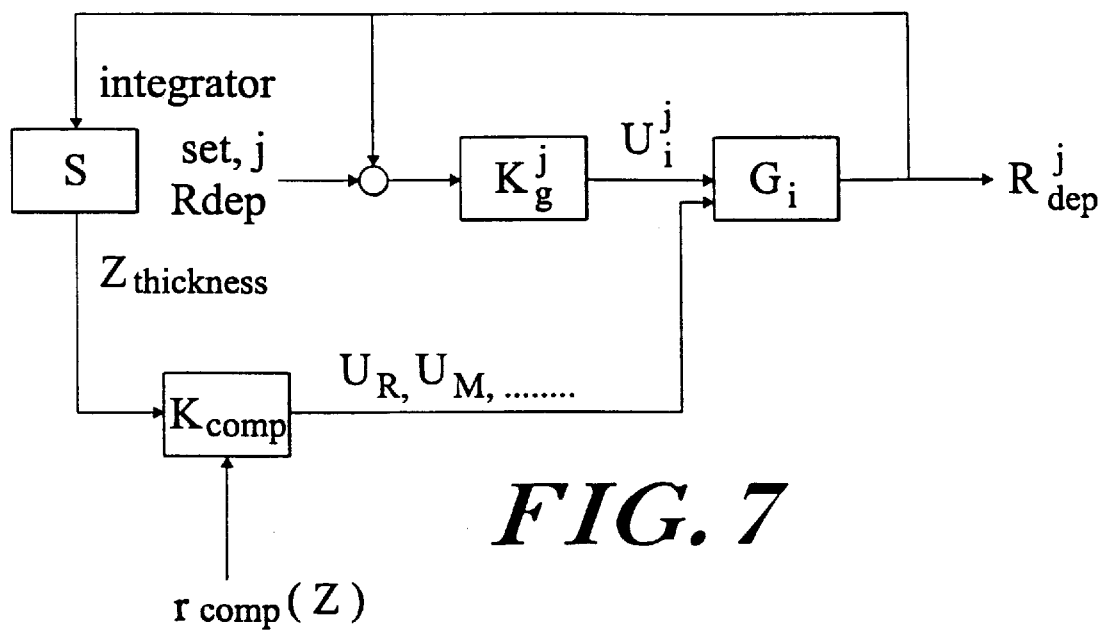
FIG. 7 shows a control structure which allows coordinated composition-thickness control.

It may be desirable to vary the composition of the coating as the coating is growing to achieve various objectives, such as functionally grading the coating to match the thermal expansion coefficient of the substrate and then to gradually change the thermal expansion coefficient. This can be achieved by integrating the deposition rate to determine the coating thickness (or measuring coating thickness directly) and then adjusting the chemicals and/or deposition conditions to favor different compositions in the reactions (see FIG. 7). FIG. 7 shows a control structure which allows coordinated composition-thickness control. This diagram is essentially the same as FIG. 3 except for the addition of a loop that contains an integrator S which integrates deposition rate over time to determine coating thickness $Z_{thickness}$ which serves as an input for composition control algorithm $K_{comp}$ which controls one or more input parameters U (e.g., gas flow rates and power) in order to change the composition according to the thickness of the coating, responsive to a desired functional relationship between coating thickness and coating composition $T_{comp}(Z)$.

Since coating composition is dependent on the chemical reactions that are occurring, the composition control algorithm, $K_{comp}$, may also function in a closed loop fashion based on measurement of gas species within the reactor or at the exhaust port. The nature of the chemical reaction can be inferred from measurement of local gas species within the reactor or in the exhaust by using optical spectrometers or a mass spectrometer; a mass spectrometer and or optical techniques, used to determine either local gas composition and/or to analyze the exhaust gases, can monitor which chemical reactions are dominating the deposition process over time.

Figure 8:
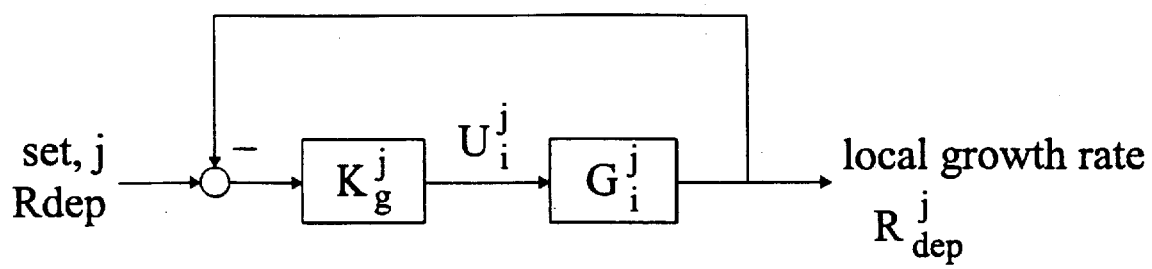
FIG. 8 is a schematic which shows a control structure which allows local compensation for depletion.

Chemical vapor deposition processes in batch reactors or hot wall reactors may be complicated by depletion of the reactants by deposition on the wall or other parts. As a consequence, the local coating growth rates may vary from part to part. This can be compensated for by either (a) adjucting a local actuator (such as temperature, other local energy source, or local flow of reactant) that compensates for errors in locally measured deposition rate (see, e.g., FIG. 8), or (b) selection of the operating regime (i.e., set points for other variables not directly manipulated by the closed loop system, see discussion below) to limit the effect of depletion. FIG. 8 is a schematic which shows a control structure which allows local compensation for depletion. This diagram is essentially the same as FIG. 3 except that the output is local growth rate $R_{dep}^j$ and the input is $U_i^j$, where $U_i^j$ is the selected actuator in the local area to maintain the jth deposition rate. The concept of local control can be incorporated into other control designs described herein to control any actuator which will adjust local conditions based on a measurement related to local growth rate.

Figure 9:
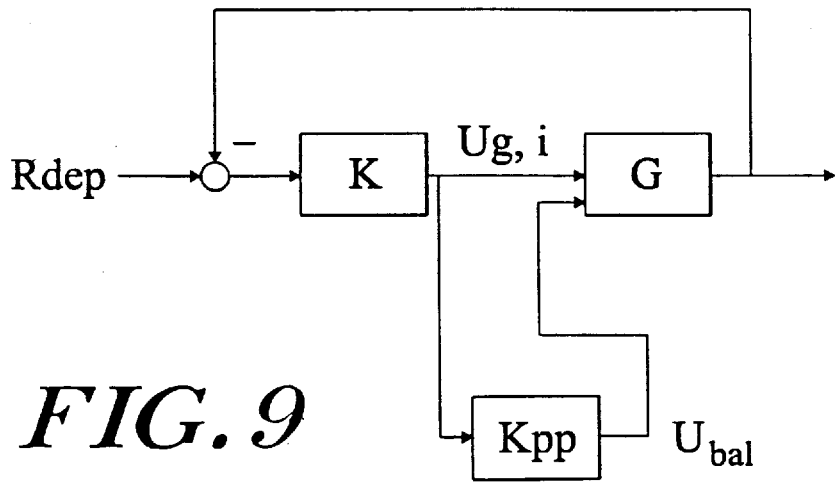
FIG. 9 is a schematic showing a control structure with partial pressure compensation.

Another important regulation strategy is to coordinate changes in mass flow rates to maintain local partial pressures. When the gas flow rate of any one of the reactant gases is adjusted to control the process, all the ratios of partial pressure change at the same time. This invention contemplates including a "ballast" gas in the gaseous mixture fed into the reactor. Varying the mass flow rate of the ballast gas to compensate for the changes in reactant gas flow used in process control will prevent change of other local partial pressures. FIG. 9 is a schematic showing a control structure with partial pressure compensation. This diagram is essentially the same as FIG. 3, except for addition of a control algorithm to balance partial pressures $K_{pp}$ which directly controls ballast gas $U_{bal}$; $Ug_i$ is the gas flow rate of one of the reactant gases. Such structures are used when the input selected is a gas flow rate or total pressure and it is desirable to keep the other gas input partial pressure constant in order not to selectively change the deposition condition.

Coordination of control action with selection of operating regime may be essential for optimization of the control system of this invention. A critical dynamic feature in batch reactors is related to the mass flow input variables (i.e., each of the different reactant species) which are subject to transport delay due to the time it takes for changes in mass flow rate of a particular reactant to propagate through the reactor, which scales with the distance/gas velocity. The delay time poses a fundamental limitation on the achievable closed loop performance of the system in that the closed loop bandwidth can not exceed the reciprocal of the delay time, $T_{delay}$. When it is necessary to increase the bandwidth beyond this limit, it is necessary to decrease this time delay or find an actuator that does not involve it.

To decrease the delay, one could increase the flow rate, Q, since $T_{delay}=V_{react}/Q$ where $V_{react}$ is the volume of the reactor and Q is the volumetric flow rate going through the reactor. This however has the affect of decreasing reactant utilization. Coordination of control action with operating regime can be implemented by coordinating the choice of the operating regime (such as total flow rate) with more direct control objectives handled as described herein.

Implementation of the control structure

Control methods according to this invention can be used in any CVD reactor for any type of coating. CVD coatings are enabling technology which is utilized in a number of different application areas including engines, cutting tools, optics, and microelectronics. The type of coatings include amorphous, crystals, ceramics, metals, unique compounds, refractory materials, semiconductors, and composites. Some example coatings include AlN, SiC, $SiO_2$, GaN, ZnO, WC, TiN, TiC, $MoS_2$, YSZ (yittria stabilized zirconium), AlGa, BN, SiGe, $TiO_2$, $TiSi_2$, ZnSe, Silicon Nitride, mullite, and diamond. CVD reactor configurations suitable for control according to this invention include cold wall reactors, hot wall reactors high energy, plasma reactors, etc.

Measurement of deposition rate in real time can be obtained from a variety of methods including use of a microbalance, sacrificial sensors whose electrical properties vary with coating thickness applied, and various light reflecting techniques. These sensors should be sensitive over the range of conditions expected for the particular coating (ie coating thickness and material).

There are a wide variety of methods for temperature measurement including thermocouples and optical sensors that can be used to determine the temperature of the substrate and coating. The temperature on the surface of the growing coating layer may be measured directly or it may be measured indirectly by taking a measurement that is related to the surface temperature. For example, in most cases the temperature of the bulk substrate is closely enough coupled to the temperature of the coating surface that it is a suitable approximation of the surface temperature and can be used for control purposes. Optical methods are flexible since both point and surface temperature distributions can be determined. Optical probes that have been used by Sheldon, et al., (1991) *Mat. Res. Soc. Symp. Proc.*, Vol. 202, pp. 161–166, Sheldon, et al., (1990) *Mat. Res. Soc. Symp. Proc.*, Vol. 168, Boninot, et al. (1992) Amsterdam, and Aspnes (1990) *Physi-* cal Concepts of Materials for Novel Optoelectronic Device Applications I, hold good promise in this area (see also Moslehi, et al., U.S. Pat. No. 5,446,825). The surface temperature is a very important parameter mainly in cold-wall reactors. Traditionally, thermocouples and pyrometers have been the instruments of choice in CVD. They both, however, have their own drawbacks, precise measurements with thermocouples requiring intimate contact with the sample and pyrometry depending on the surface's emissivity. Recently the use of infrared interferometry as a temperature probe has been explored by Saenger, et al. (1991) Appl. Opt., 30(10):1221–1226. Ellipsometry have been proposed by Kroesen et al. as in-situ temperature probes for semiconductor films at the pre- and post-processing stages. In these methods the substrate is also the sensor and strong requirements must be imposed on the optical properties of the film.

While it is difficult to obtain a realtime measurement of coating microstructure under the typical conditions of CVD, several measurement methods have been developed from which the user can infer the resulting coating microstructure. Such measurement methods act as in-situ probes to acquire realtime information on film micro-structure, morphology and surface temperature. Many of the optical methods described above reflect one or more characteristics of the coating structure, and therefore may be used as microstructure probes. In these methods, it should be remembered that the substrate is also part of the sensor, and useable measurements may be somewhat dependent on the optical properties of the film that is being deposited on the substrate surface.

Any input that can varied in real time, and that will result in variations in the growth rate and/or microstructure, may be suitable for use in the control structure. Inputs include mass flow rate of the reactant species (which can be introduced as gases or by aerosols), total pressure of the reactor, thermal energy which can be provided by a variety of sources such as resistance or induction heating, light sources, laser light, other radiation sources (such as microwaves or RF fields) that both can heat up the substrate and the reactant gases, and bombardment of the surface by ions, atoms, or electrons.

Actuators which control these inputs in accordance with input parameters include various thermal actuators, controllers of radiation intensity or energy level (frequency), mass flow controllers, and pressure regulators. The partial pressure balances of the different reacting species can be controlled by conventional mass flow controllers. Energy may be supplied to the reactants in the reaction chamber in various forms, depending on which CVD system is in use.

In conventional CVD, the reaction chamber (and the enclosed gas) is heated by resistance heaters or the substrate may be heated directly by induction heating. Alternatively, energy may be supplied directly to the gaseous phase by microwaves to convert the gaseous phase to a plasma (see, e.g., Echizen, et al., U.S. Pat. No. 5,069,928, and Moslehi, U.S. Pat. No. 5,082,517). In another alternative, lasers may be used for direct local heating of the substrate, as may ion beams (see, e.g., Tao, et al., U.S. Pat. No. 5,104,684). For realtime control, it may be necessary to both rapidly heat and cool the substrate. While it is easy to design well regulated heaters that can maintain a desired thermal profile and can change quickly to achieve a new higher set point, it is also desirable to design an actuator for rapid cooling. This can be achieved for example, by adding blowers to force cool air over the external surface of the reactor.

Selection of output measurements and input parameters

Implementation of the control structure requires selection of particular variables as outputs and inputs as well as specification of measurement instruments to quantify the real time output for comparison to the desired setpoint, and selection of actuators which will be adjusted to implement the input parameters determined by the control algorithm. Based on the specific dominant physics of the process and the desired growth conditions, different input variables and actuators should be selected to achieve the desired performance.

For different systems and coatings, it is necessary to determine which input actuator (i.e. temperature, pressure, or partial pressure of each specie) should be manipulated in real time. Each coating will require a particular configuration of actuator selection, but once chosen appropriately, will achieve the desired control performance. Important factors to consider in determining the actuator include the desired output, process dynamics and coupling, as well as coating performance specifications (i.e. uniformity requirements, thickness, and growth rate, which determines production rate) since this will suggest which operating regime should be selected.

Analysis of the dynamics of the complete system and of the relative actuator effectiveness are essential for a successful control design. Design of an appropriate control structure can be based on insight obtained from analysis of the frequency response of the linearized process in terms of performance (disturbance rejection, command following capability) and robustness (maintaining stability and good performance in spite of model errors). Good closed-loop performance is obtained for frequencies at which the open-loop gain (i.e., the magnitude of gk as a function of frequency), determined by the characteristics of the controller and plant, is large. However, sensor noise, model uncertainty, and zeros in the right half of the complex plane impose constraints in open-loop gain magnitude that is used. Properly shaping the frequency response of the controller can provide good performance for a wider range of frequencies subject to these limitations. In order to design an appropriate control structure, it is desirable to select the input which can achieve the best performance.

Actuator effectiveness can be evaluated in terms of the gain and bandwidth for the particular input. Since large open-loop gains of gk are required to achieve small error as well as high closed-loop bandwidth (i.e. fast settling time), actuators with either small input/output gains or narrow bandwidth would require large controller gains, which could lead to actuator saturation and/or robustness problems (i.e., the closed-loop system might become unstable due to model error or plant variation). These limitations must be evaluated relative to the actuator range and to the error and bandwidth performance requirements of the closed-loop system.

Gain is defined as the magnitude of the transfer function g which maps an input value to an output value (g determines the output variation y due to a change in input u, where this gain is evaluated as a function of frequency). Because we are interested in comparing the performance of several inputs which are measured in different units, it is necessary to scale the equations appropriately. Specifically, the equations are scaled in a non-dimensional form so that the response of the plant's output due to changes in the inputs can be compared on an equal basis. This is done by expressing both inputs and outputs as a fractional variation of their nominal values. In experimental terms, this can be accomplished by determining the magnitude that represents the fractional variation by which the output measurement changes when each input parameter is changed by the same percentage.

The dynamic aspects of the system can be evaluated in both the time and frequency domains. The time constant relating the input parameter and the measured output is the characteristic relaxation time observed for the measured output value to settle into a new steady-state value in response to a single-step change in the input parameter. By definition, bandwidth is the reciprocal of the time constant and has units of frequency (radians per second). Outputs which respond promptly to changes in an input parameter demonstrate that the output/input pair have a short time constant and wide bandwidth.

Actuators, and consequently the input parameters on which adjustment of the actuators is predicated, are preferably selected to have significant gain over the range of frequencies relevant to the process. Experimentally, gain corresponds to the fractional change in measured output observed when the level of an input is changed by a specified amount. In particular, the effects of various inputs on a particular output can be compared by comparing the percent by which the measured output changes in response to the same percentage change in the level of each input under consideration. A larger gain reflects greater effect of the particular input on the output measure being monitored. Basing the analysis on fractional variation will allow comparison across different input types.

In summary, the actuator selected for closing the loop should be determined by considering the gain (relative impact) and bandwidth (how fast an affect it has on changing the growth behavior. While there are trade-offs to consider (such as expense or difficulty in varying a particular input), one typically wants to select the actuator with the greatest effectiveness. The "best" actuator from a frequency point of view is typically that which has the greatest gain-bandwidth product. Gain for each actuator should be analyzed as the fraction in output level change for a fractional variation of the input (thereby avoiding ambiguities due to comparing inputs with different units and absolute values). Bandwidth corresponds to the inverse of the dominant time-constant of the system, which corresponds to the frequency where the Bode plot gain begins to roll-off (i.e., decrease).

For example, gain for growth rate of the surface coating corresponds to the amount of alteration in growth rate resulting from a proportional change in an input parameter, and usually the control structure makes use of inputs with large gain. At low temperatures, where the deposition rate is slow, mass transport variations do not significantly affect coating uniformity. In this case, temperature variations within the reactor would result in a variation in growth rate of the coating, and input parameters which affect heating should be considered for control purposes. At higher temperatures, mass transport limitations become significant, resulting in coating variations in response to variations in partial pressure of the reactants. Thus, the preferred actuators for control of processes operating at high temperature are those involving mass flow.

The impact of each actuator varies depending on the choice of operating regime. Both the control structure and the control algorithm are sensitive to the operating regime. If a good coating can be grown within a narrow range of conditions, then a linear control approach (such as PID controllers) will be effective, otherwise a nonlinear predictive or adaptive technique would need to be used. Contrarywise, the choice of algorithm is more critical if the CVD apparatus controlled by the control system is expected to perform under a wide range of conditions.

The primary economic process objectives are process throughput, and coating uniformity and quality. Both of these factors must be considered in terms of selecting an appropriate operating regime. Throughput is maximized by depositing at the highest growth rate and/or simultaneous coating of multiple substrates. However, throughput must be achieved subject to the limitations posed by uniformity and coating quality requirements.

Factors that determine coating uniformity can be identified for the surface-dominated and mass-transport-limited operating regimes. In the surface-dominated regime, growth rate is most sensitive to temperature variations through the reactor. Thus, if it is desirable to grow in this regime, design and/or active control of the temperature distribution is critical. Notice, however, that the surface regime corresponds to the slowest growth rates.

Operating in the mass transport regime, while achieving faster growth, results in growth rate variations in complex shapes or in the extent that multiple parts are coated. While the latter can be compensated for by adding multiple reactant feed points throughout the reactor, this still would entail a complex flow regulation scheme, since growth rate variations are dependent on the operating point.

Besides meeting the materials objectives, it is necessary to meet the production objectives of yield, reactant efficiency or utilization, and production rate. Typically, for example, high growth rates are achieved at high temperatures. At these high temperatures, for batch reactors, there is a variation of reactant concentration due to the fact of the deposition on all these surfaces. Thus process yield defined by coating uniformity (part-to-part) typically becomes a problem at higher deposition rate. Similarly, when there is high utilization of reactants, i.e., high efficiency, then there will likely be a large variation in growth rates since the reactant concentrations will change throughout the reactor.

Selection of the appropriate operating regime will therefore need to be done in consideration with the production objectives and trade-offs. One way to maintain uniformity is to either operate at low temperatures (with low growth rates) or at vary high flow rates (leading to low efficiency). This trade-off can be quantified by the following relation which determines if depletion is significant. The expression is based on a mass balance that relates the change in partial pressure of the reactant advected along the length of the reactor to the rate at which it is taken out of the gas stream by deposition as:

$$\left(\frac{\Delta P_i}{P_i}\right) depl = \frac{M_{dep}^i RT}{QP_i} \quad (0.1)$$

where $M^i_{dep}$ is the total mass flux deposited from the inlet of the reactor. When the depletion ratio ~1, then depletion will be significant.

One feedback solution to this limitation is the use of a closed loop system that measure the local deposition rate ($R_{dep}^j$) and adjusts a local input $U i^j$ to compensate for variations. In many cases, the easiest actuator to use is the power input in such a case, i.e., to change the local temperature.

Selecting control algorithms

The type of control algorithm that should be used in the control structures of this invention depend on the specific nature of the coating process as well as processing objectives. This section outlines some additional considerations. Important considerations include the relative time scales of important process events (which determine whether the process dynamics need to be incorporated in the control design) as well as the need to switch operating regimes (which determine if a linear control approach is applicable or a nonlinear approach is required).

Dynamic consideration of the precess to identify several time scales is useful before considering the control algorithm design. Important times include the time constant for the process ($T_{batch}$), time for particular features ($T_{feature}$), and time for an individual batch ($T_{batch}$). $T_{process}$ represents the dominant time constant of the particular process/reactor and can be identified through either model studies or experiment from a step response of the different inputs. $T_{batch}$ is the total time it takes to growth the entire coating, whereas $T_{feature}$ is the time it takes to grow a desired feature, such as the desired grain size.

If $T_{feature}$ is less than $T_{process}$, then a steady-state controller can be used (i.e., one does not need to consider the dynamics of the process in designing the controller). Such a controller can essentially utilize PI control logic where the integral action assures that there will be zero steady-state error. If $T_{feature}$ is greater than $T_{process}$, then it is important for the controller to be designed with knowledge of the process dynamics. From a frequency-based-control design approach, it is clear that the process dynamics should be considered through the desired closed-loop bandwidth to ensure robustness.

In the later case, if the system is to be operated in a small enough perturbation around nominal operating condition so that a linear approximation of the system is valid, then linear control design methodologies are appropriate. Depending on the performance requirements, one could utilize PID loops, modern frequency techniques such as H infinity, LQG/LTR, model-based-control, or model predictive control. If flexibility to handle unknown reaction constants is required, adaptive control techniques can be used. In contrast, if it is desired to be able to operate over a wide range of operating conditions such that a single linearization is no longer valid, various nonlinear methods can be utilized including nonlinear versions of model-based and model-predictive control, as well as neural-network-based control approaches.

The control algorithm can be based on a model of the process. This model can be either empirically or analytically derived. For example, if dynamics are not important, the specific control algorithm to be used for this level of control can be obtained from an experimental study that maps out the correlation between temperature, growth rate, and temperature.

An important aspect of CVD systems that in many cases can pose a fundamental limitation on the achievable closed loop control performance is the transport delay associated with the flow of gases throughout the reactor. The overall delay factor is given by $V_{react}/Q$ where Q is the total flow rate and $V_{react}$ is the volume of the reactor. This time delay poses a limit to how fast the closed loop system can respond (or the reciprocal is the limitation in terms of closed loop bandwidth). If the required bandwidth or closed loop time constant needs to be faster then this limit and it is desirable to use one of the gas mass flow rates as an input, it is necessary to coordinate selection of the operating regime (i.e., those inputs selected by the operator but not used for closed loop control). In this case, one would increase the flow rate Q such that the bandwidth limitation posed by the time delay is greater then the required bandwidth. Generally, the delay factor will be less than $T_{feature}$, and a smaller delay factor leads to better achievable performance for the system.

As the discussion above suggests, although other factors may play important roles in the process, independent feedback control of temperature and deposition rate are a first step in controlling micro-structure in real-time. For cases in which the influence of surface processes on mobility can be neglected, the coupling between rate and mobility can then be ignored. Deposition rate then becomes unilaterally coupled to temperature (i.e. a change in power will change both temperature and deposition rate, but changes in mass flow will affect only deposition rate, not the temperature). Such simplified structure is shown in FIG. 4. One can employ two independent single-input-single-output (SISO) loops to control temperature and deposition rate independently. The control structure is based on the realization that the temperature loop will act as an output disturbance on deposition rate, but there will be no back coupling. Utilizing the closed-loop system designed earlier in this chapter for deposition rate control and adding a loop to control temperature allows for the required MIMO control. The performance of the proposed control strategy is illustrated in Example 3. This Example describes simulated behavior of temperature and deposition rate for the closed-loop system, using the nonlinear model at the low temperature operating point, which would be the most challenging. Example 3 shows that the heater's input power and the $TiCl_4$ partial pressure can be independently controlled, with resultant enhanced control of coating microstructure.

If the effect of other surface processes on mobility is significant, a full multi-variable treatment of the problem becomes necessary. Well established methods and concepts on multi-variable control system (such as block relative gain Manousiouthakis, et al., (1986) AIChE, 32(6):991–1003), singular value analysis Lau, et al., (1985) *AIChE J.* 31(3):427–439, and internal model control Garcia, et al., (1982) *Ind. Eng Chem. Process Des. Dev.*, 21(2), can be used to analyze such cases.

Commercial operation of CVD requires consideration of production objectives beyond just the materials objectives. The production objectives can be expressed in terms of coating uniformity, production rate, and reactant utilization efficiency. While the control structures described do not directly address these considerations, they do provide the basis for maintaining the CVD system at operating conditions that have been determined to meet these considerations. The selected operating point must be determined from consideration of the trade-off between coating uniformity (both for a single part, and from part-to-part in large batch reactors) versus the production rate and reactant utilization considerations.

Coating uniformity is determined by two aspects of the deposition physics: a) temperature uniformity and b) mass transport variations. Analysis indicates that the latter is most significant at higher deposition rates where mass transport limitations can occur due to either diffusion or depletion affects (the latter could occur due to deposition on reactor walls and/or other parts in a batch reactor). Thus, the trade-off is to maximize deposition rate subject to the limitation of coating variations.

The coating variation limitation posed by mass transport limitations at high growth rates can be offset by utilizing different temperatures in different parts of the reactor to offset the reduction in reactants. This can be accomplished within the control structures according to this invention by utilizing different growth rate sensors along the reactor and feeding back deposition rates to adjust the local temperature. Temperature at a specific location can be adjusted by using segmented heaters or other localized thermal inputs such as lamps. Other actuators could be used to compensate for localized growth rate variations, although entailing some engineering difficulties, include a gas manifold system devised to provide additional reactants at different locations.

The benefits of the invention for control of CVD coating growth are even more apparent in view of the difference in requirements between coating development and production regimes. In developing a new CVD coating and bringing it to market, one typically starts with a series of coating development studies utilizing research scale reactors. Once the desired coating properties are established on test wafers, one then moves to coating sample parts, which are subjected to extensive use tests. Following successful development of the coating in actual use, one then typically needs to scale up the coating process to production-scale machines. Typically, in all of these steps, many series of coating experiments are required to determine the process recipes (in particular, the settings of input levels) that achieve the desired coating characteristics. Since design is iterative, the whole process recipe will have to be revised repeatedly to account for different coating requirements, such as the need for different part shape and/or coating thicknesses. In an era where time-to-market is a critical component of business viability, use of the control method of this invention can significantly reduce these development times. In addition, it also enables business to custom tailor coatings for small-lot applications. These benefits of the invention derive from the fact that it automatically adjust the input setpoints to achieve the desired conditions, thus cutting down on the time to develop new coatings.

Even once a coating has been successfully developed and scaled up to production-scale reactors, in many cases there are process variations and disturbances which result in unusable coatings (i.e., that do not meet product specifications). There are a variety of factors that can cause such problems including variations in feedstock material (both the input gases for the process and the parts to be coated), variations in the equipment (due to aging, variations in the internal surfaces, external ambient conditions), and operator error. Since the invention is a method to measure the actual coating quality, and make automatic adjustments if there is an error, many of these problems can be compensated for, thus increasing yield levels.

Another major reason the invention is useful is that it enables tighter control of both coating structure and composition. Thus, coatings produced using control according to this invention will more frequently achieve the designed attributes of engineered coatings for specific applications. Features that are important to be able to reliable achieve include specific microstructure, and composition control that may vary as a specified coating thickness. While such multi-layered and custom designed coatings have already been developed, the greater number the coating attributes, the more difficult it is to develop the process recipe. Thus the invention aids in increasing accuracy of production for such custom designed coatings, despite their complexity. Since the invention enables one to control the deposition rate, it is also easy to determine what coating thickness has been laid down and then adjust the composition according to a specific design, whether the composition variations may be sharp or gradual. Prior to this invention, there was no way to ensure that such variations were achieved except by trial and error.

EXAMPLES

In order to facilitate a more complete understanding of the invention, a number of Examples are provided below. However, the scope of the invention is not limited to specific embodiments disclosed in these Examples, which are for purposes of illustration only. The control structures of this invention are exemplified through the deposition of titanium nitride. This material was chosen because a relatively large body of experimental work on its chemical vapor deposition exists and due to its importance in industry. Titanium nitride (TiN) is one of the materials used commercially for hard and protective coatings, and as a conductor in micro-electronics.

CVD of TiN has been experimentally studied by a number of authors on a variety of substrates Nakanishi, et al., (1990) *J. Electrochem. Soc.,* 137(1):322–328, Langmuir (1916) *J. Am. Chem. Soc.,* 38:2221–2295, Kim, et al. (1983) *Thin Solid Films* 107:129–139, Dekker, et al., (1994) *J. Electrochem. Soc.,* 141(3), Sjostrand (1979) *Proceedings of the Seventh International Conference on CVD*. In structural applications, TiN has usually been deposited at atmospheric pressures in hot-wall reactors using nitrogen $N_2$), titanium tetrachloride ($TiCl_4$) and hydrogen ($H_2$). Kim, et al., (1983) *Thin Solid Films,* 107:129–139, investigated the effect that deposition temperature, total flow and titanium tetrachloride inlet partial pressure have on deposition rate, preferred orientation and surface morphology of TiC/TiN coatings on cemented tungsten carbide substrates. Nakanishi, et al., performed experiments under conditions of minimal influence by mass-transport and proposed a set of Langmuir-Hinshelwood-type equations as a model of the surface chemical kinetics. Similar studies were reported earlier by Jang, et al., and more recently by Dekker, et al. In spite of all this research activity, many aspects of the process still remain to be understood. Widely different experimental results have been obtained from experiments performed in very similar equipment. Dekker et al., have proposed that feed-rate limitations in the process are responsible for the relatively wide range of apparent activation energies obtained by different researchers. However, they present no systematic analysis to confirm their hypothesis, since they lack an overall model to represent the coupled input-output mappings of the different studies. experiments using the control structure described herein can be useful as a tool to facilitate exploration of these issues.

Example 1

Control of the deposition rate using $TiCl_4$ partial pressure as the actuator.

The expected performance of a single-input, single-output feedback system is often specified in terms of the desired closed-loop bandwidth, phase margin, and steady state error. The bandwidth determines the speed of response of the system and desired bandwidth can be chosen based on the maximum time allowed for the correction of an output error. To select the bandwidth of the deposition rate controller, consider a deposition rate of 6.81 $\mu$m/hr and a coating thickness of 1oam. (This rate has been reported by Kim, et al.) To prevent errors in the deposition rate from affecting more than a fraction of the coating, the controller should correct for deviations in the rate in less time than what it takes to deposit this fraction of the film. Thus $\tau_{c1} \leq (d/R_{dep}) f_{error}$, where d is the coating thickness, $\tau_{c1}$ is the closed-loop time constant, $R_{dep}$ is the deposition rate, and $f_{error}$ is the fractional error that can be tolerated. For the above deposition rate and an acceptable fractional error of 0.01, this time is (10 $\mu$m)(0.01)(3600s/hr)/(6.8 $\mu$m/hr)=52.9 seconds. If 99% of the error must be corrected, this time would represent five time constants of the closed-loop system. The desired bandwidth can be approximated by the reciprocal of the time constant of the system, or about 0.1 rad/sec.

Controller design is discussed for a system having the following specifications. The phase margin is a measurement of robustness and an indication of the maximum model error that can be tolerated without affecting the stability of the system. We will specify phase margin of 40 degrees. The type (number of free integrators) of the controller determines the achievable steady state error for a particular kind of input. For perfect steady state command following and step inputs, a controller with at least one free integrator (type 1) is necessary. We shall require zero steady state error for step inputs. This will result in non-zero steady state error for ramp disturbances, such as those from factors that vary with batch time.

Figure 10A:
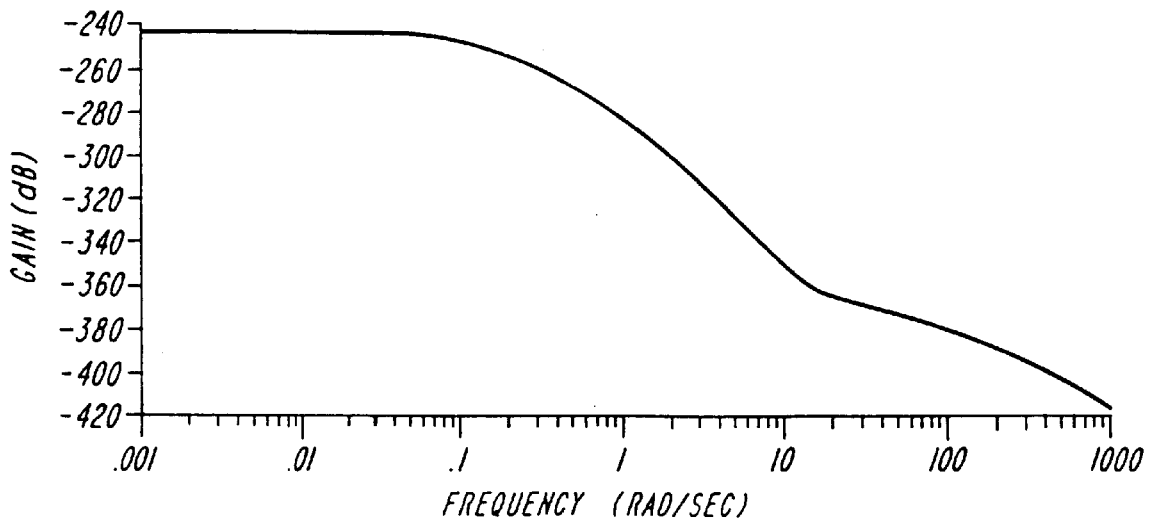
FIGS. 10A and B show bode plots for the $R_{dep}/P_{TIC14}$ gain (A) and phase (B) at 1000K.
Figure 10B:
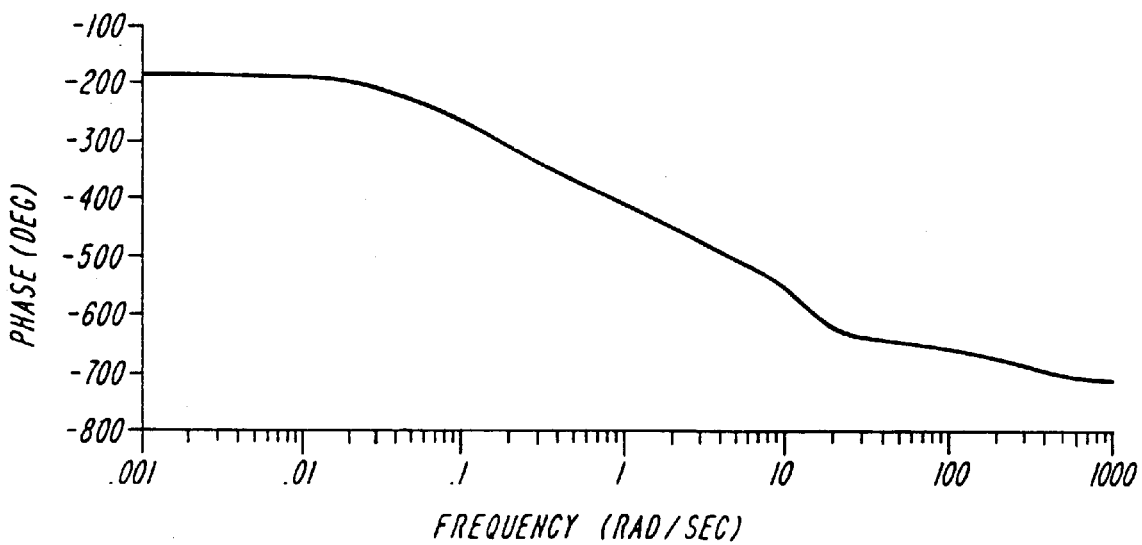

FIG. 10 A and B shows the magnitude and phase plots, respectively for the gain in the deposition rate in response to changes in $TiCl_4$ partial pressure at 1000K. These plots shows a low frequency phase of −180 degrees, indicating the negative sign of the gain. Our controller transfer function will have a negative sign, and so the low frequency phase is equivalent to 0 degrees. The system crosses the 360 degree line with a gain of roughly −266 db at about 0.4 rad/sec. This angle will become 180 degrees, due to the extra phase provided by the controller. Thus, for a 45 degree phase margin and a proportional controller, our crossover frequency will be about 0.2 rad/sec. The controller gain would be about 250 db.

This controller would satisfy the bandwidth and phase margin requirements, but to obtain zero steady state error for step inputs we must include a free integrator. Therefore, at least a proportional-integral (PI) controller is needed. Placing the zero of the PI controller at 0.01 rad/sec will introduce only about −6 degrees of phase at 0.1 rad/sec. Thus, a transfer function representing a controller that satisfies the above specifications is $g_c = -3.2 \times 10^{12}(s+0.01)/s$, where s is the Laplace transform variable.

Figure 11:
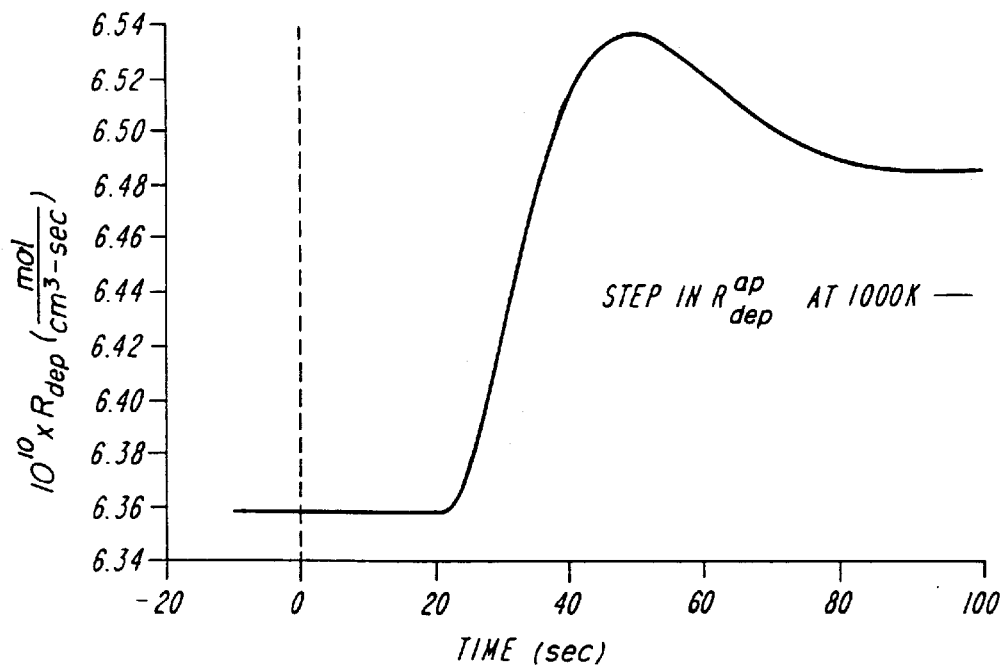
FIG. 11 is a graph showing the response of the closed-loop system to a 2% step increment in $R_{dep,set}$ at 1000K applied at t=20 seconds. The set-point after 20 seconds is $6.485 \times 10^{-10}$ moles/cm²-sec.
Figure 12:
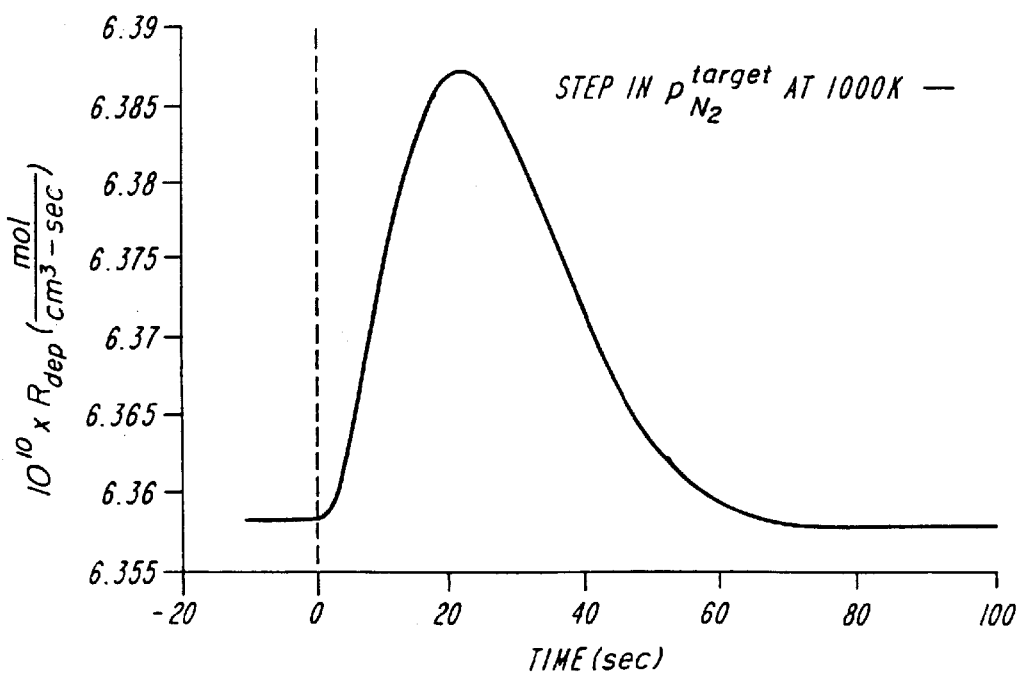
FIG. 12 is a graph showing the response of the closed-loop system to a +2% step perturbation in $P_{N2}$ at 1000K.

The response of the closed-loop system is illustrated in FIGS. 11 and 12. These plots show responses to 2% steps in deposition rate set-point, and in target $N_2$ partial pressure, at a steady state temperature of 1000K. Since this change in the target partial pressure of $N_2$ represents a disturbance to the process, the graphs illustrate the disturbance rejection and command following capabilities of the closed-loop system.

Figure 13A:
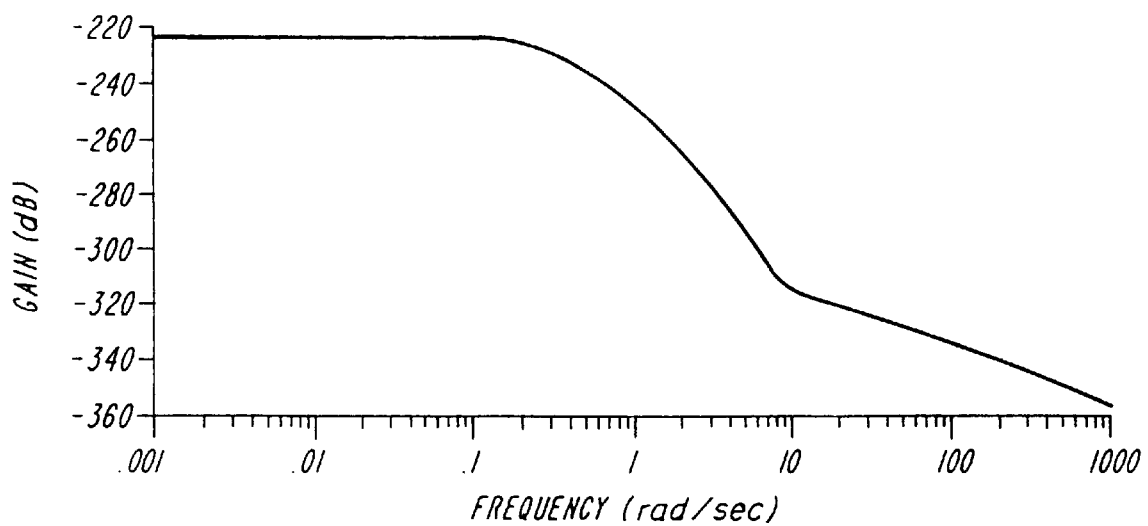
FIGS. 13A and B show bode plots for the $R_{dep}/P_{TIC14}$ gain (A) and phase (B) at 1300K.
Figure 13B:
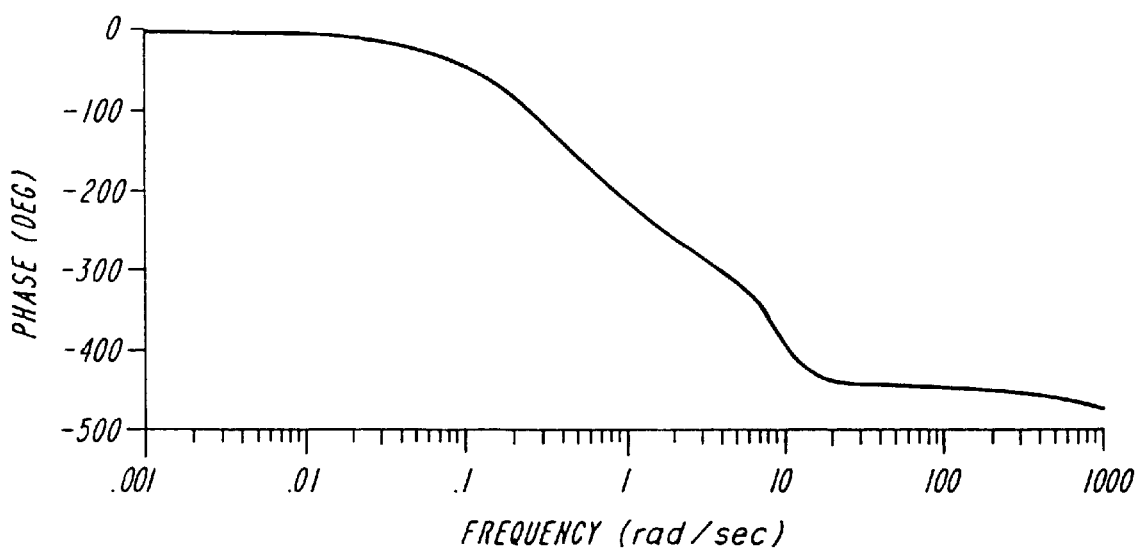
Figure 14:
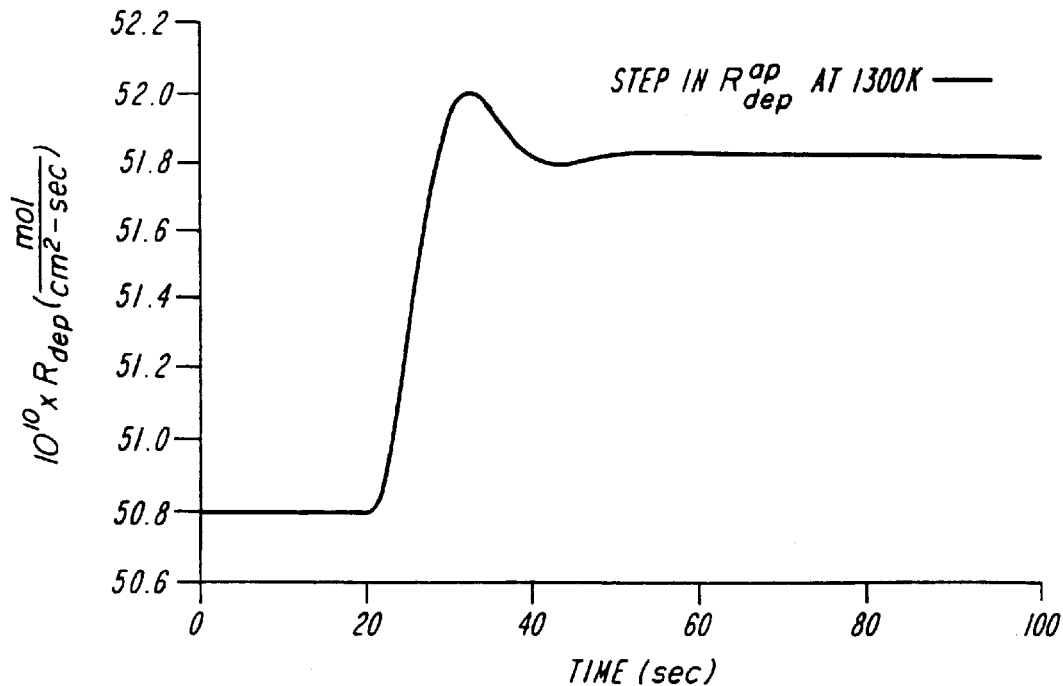
FIG. 14 shows the response of the closed-loop system to a 2% step increment in $R_{dep,set}$ at 1300K applied at t=20 seconds. The set-point after 20 seconds is $51.82 \times 10^{-10}$ moles/cm²-sec.
Figure 15:
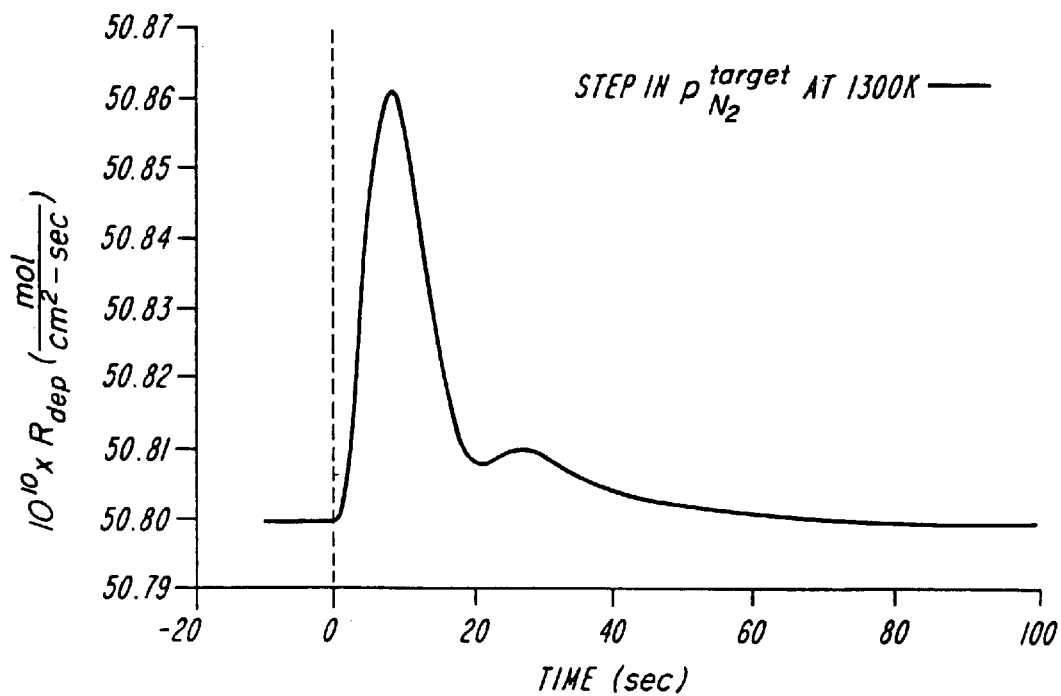
FIG. 15 shows the response of the closed-loop system to a +2% step perturbation in $P_{N2}$ at 1300K.

A similar controller was designed for operation at 1300K. The corresponding bode plot for the plant is shown in FIG. 13 A and B. Since at that temperature the input/output gain is positive, the controller needs to provide no phase inversion. The response of the plant is only slightly faster than that at 1000K. The gain is about −230 db for the frequency at which the phase angle equals −145 degrees. Thus, a PI controller will again satisfy the specifications, but this time the proportional gain should be approximately $10^{(230/20)} = 3 \times 10^{11}$. Keeping the zero of the controller at 0.01 rad/sec and adding a free integrator to satisfy the zero steady state error requirement yield the following transfer function, $g_c = 3 \times 10^{11}(s+0.01)/s$ The step responses of the closed-loop system following 2% and 5% increments in the growth rate set-point and the target partial pressure of $N_2$ are shown in FIGS. 14 and 15, respectively.

Figure 16:
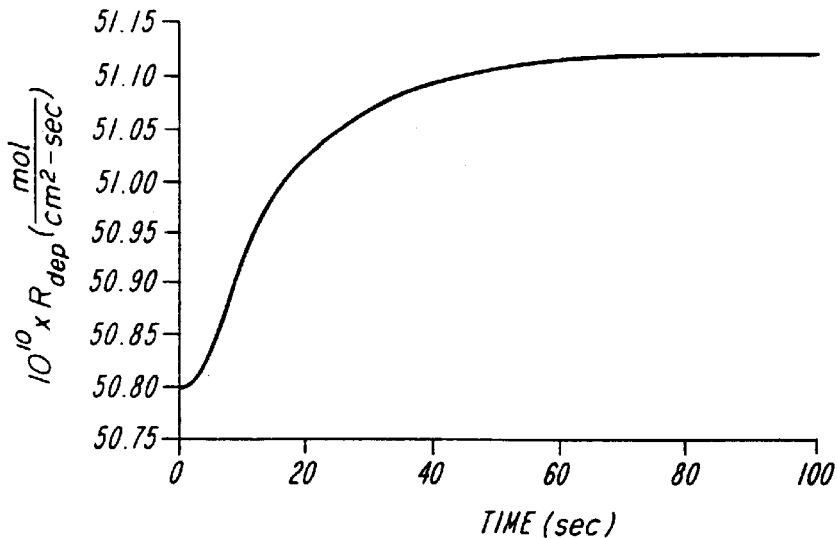
FIG. 16 shows the response of the closed-loop system to a drift in depletion at 1300K.
Figure 17:
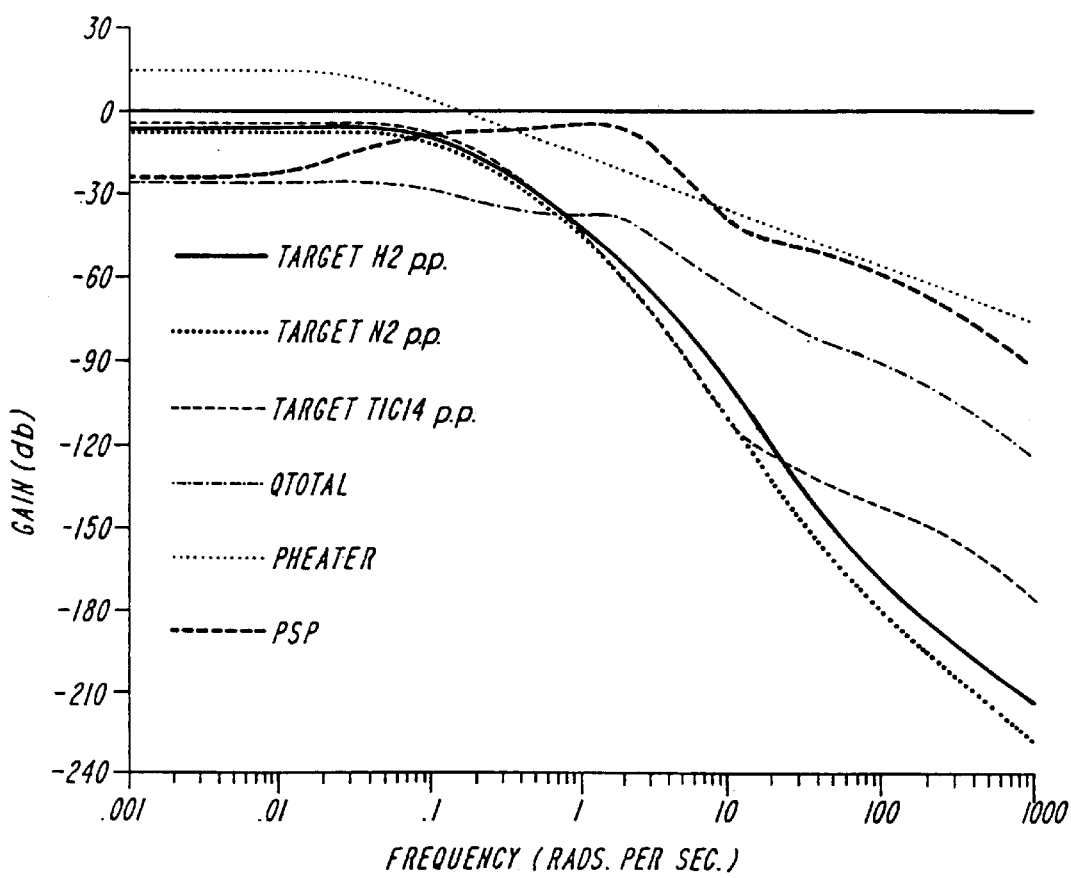
FIG. 17 shows a bode plot of a simulated CVD process at 1000K.
Figure 18:
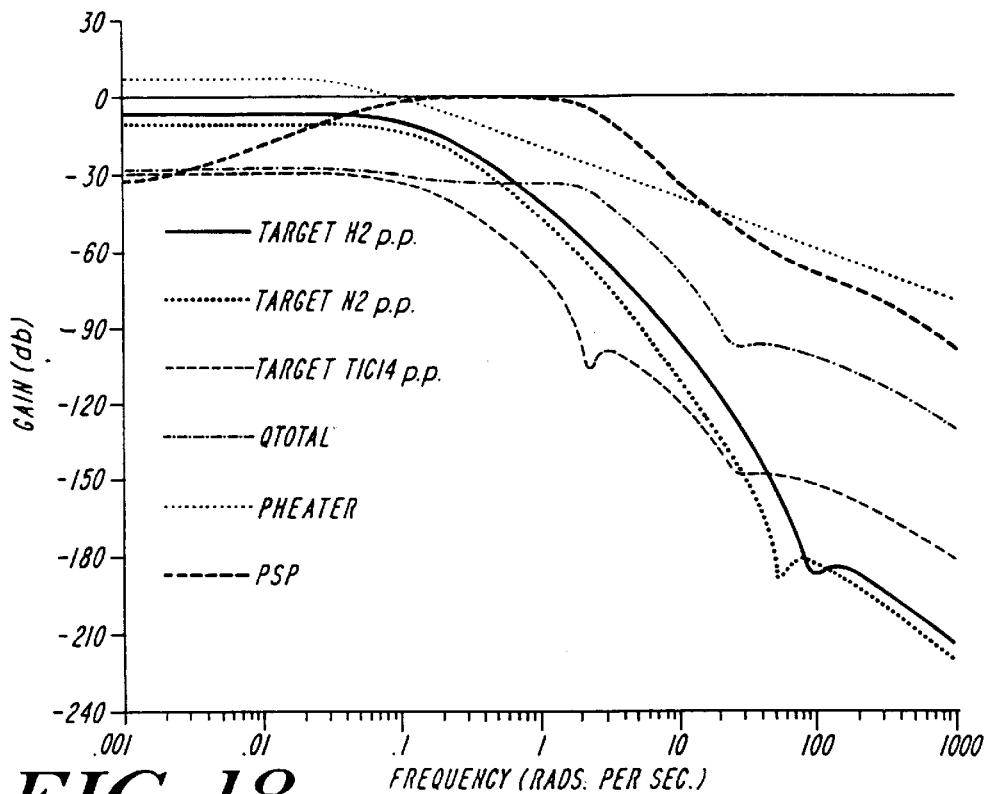
FIG. 18 shows a bode plot of a simulated CVD process at 1100K.
Figure 19:
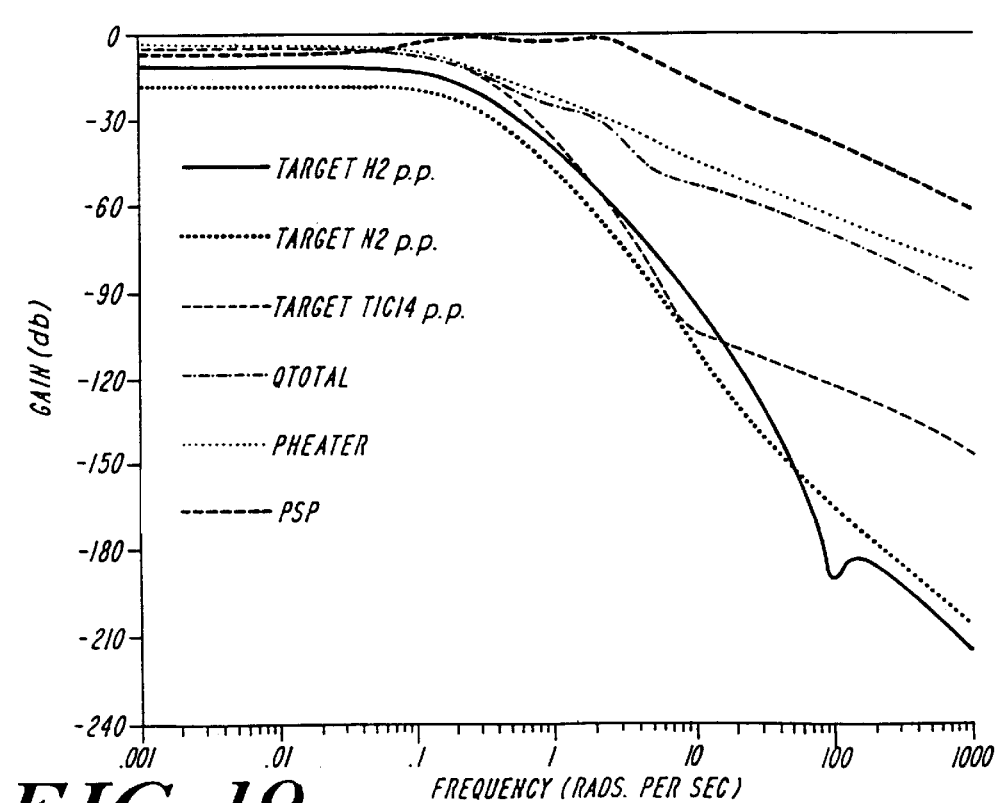
FIG. 19 shows a bode plot of a simulated CVD process at 1200K.
Figure 20:
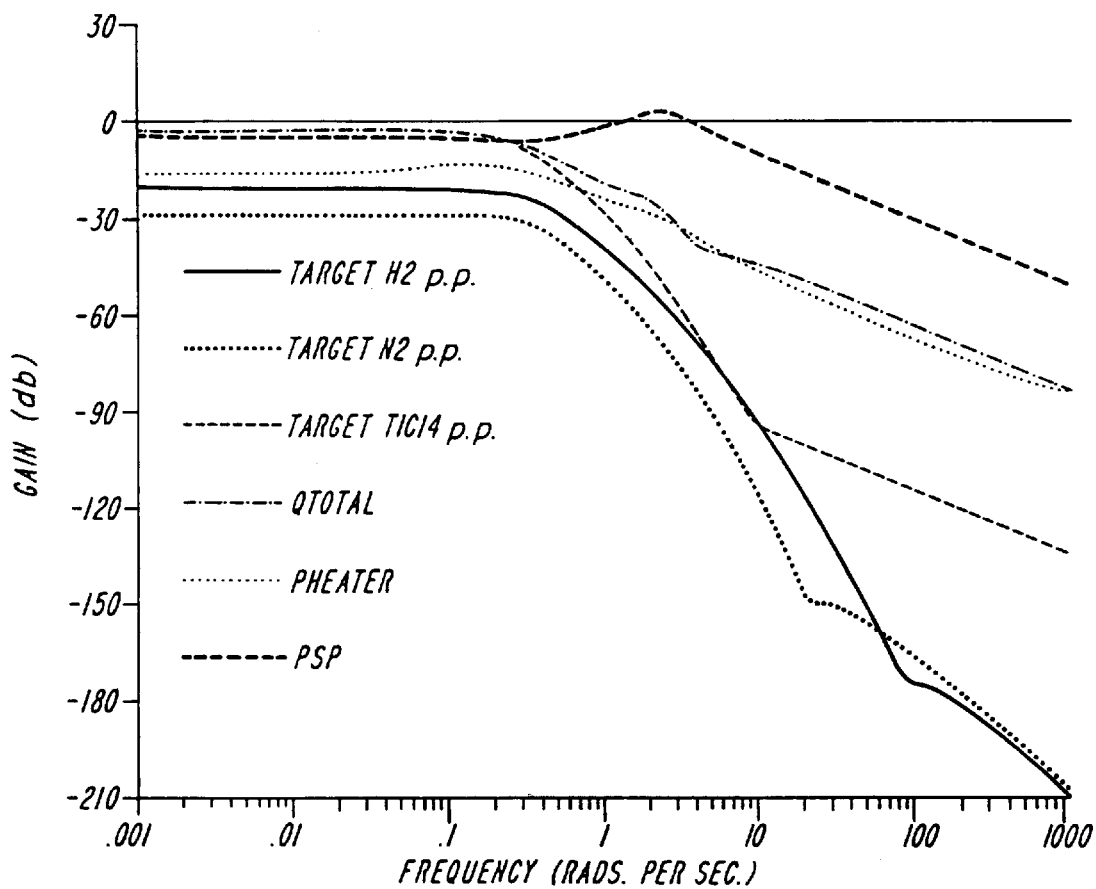
FIG. 20 shows a bode plot of a simulated CVD process at 1300K.

An example of the disturbance rejection capabilities of the controller is shown in FIG. 16. In this simulation, the amount of material being deposited on the wall was linearly reduced by 10% over the 100 seconds shown. Without corrective control action, the deposition rate would have displayed a linear increase. In contrast, the closed-loop was able to limit steady state error to a small fraction of the nominal deposition rate. Notice that the steady state error is not zero because, for a ramp excitation, this can only be achieved with a type 2 controller.

A model of the CVD equipment and process physics will provide a basis for generalizing these results for different reactor sizes and operating regimes. Given the desired closed-loop bandwidth of 0.1 rad/sec and the nominal reactor's open-loop dynamics, the parametric description of the system's eigenstructure can be utilized to find how should the control algorithm be modified. Process scale-up from a research reactor to a production scale unit, where up to 1000 parts may be coated at once, is an important aspect to consider. The dominant time constant can be shown to vary as $\tau \sim V/Q$, where V is the volume of the reactor and Q is the nominal total inlet flow. In the above design, the required closed-loop bandwidth was slower than the dominant pole of the open-loop system. However, since open-loop dynamics can become slower in large reactors, the corresponding controller might have to provide additional phase compensation. Assuming that no significant ramp disturbances are present, either a PID or a lead-lag controller may be more appropriate for such cases.

The present invention also provides a basis for developing adaptive control algorithms to enable operation over a wide range of conditions and to deal with unknown reaction kinetics. Important tuning parameters are the local sign and magnitude of the input/output gain associated with the selected actuator.

Example 2

Evaluation of potential input parameters by frequency analysis

Design objectives for the control of TiN deposition by CVD include control of the rate at which the coating is laid down and independent control of factors associated with coating microstructure. Given the availability of six manipulable inputs in the TiN coating system, it is important to identify the activators which will best achieve the control objectives, which will then be used to develop an appropriate controller. Actuator effectiveness can be evaluated in terms of gain and bandwidth.

Actuators with large gains (expressed as the fractional change in measured output in response to a fractional change in the level of one input) are required to achieve small closed-loop error as well as high closed-loop bandwidth (i.e. fast settling time). Actuators with either small input/output gains or narrow bandwidth would require large controller gains which could lead to actuator saturation and/or robustness problems. These limitations must be evaluated relative to the required closed-loop bandwidth to achieve the control objectives.

The frequency responses of a linearized CVD model are shown in FIGS. 17, 18, 19, and 20 for T=1000K, 1100K, 1200K and 1300K, respectively. These plots show the magnitude of the impact that each input has on the growth rate at a particular frequency. Besides the absolute magnitude, the frequency range over which the magnitude is uniform (i.e. the bandwidth) is important. In general, the larger the bandwidth the faster the response of the open-loop system.

Figure 21A:
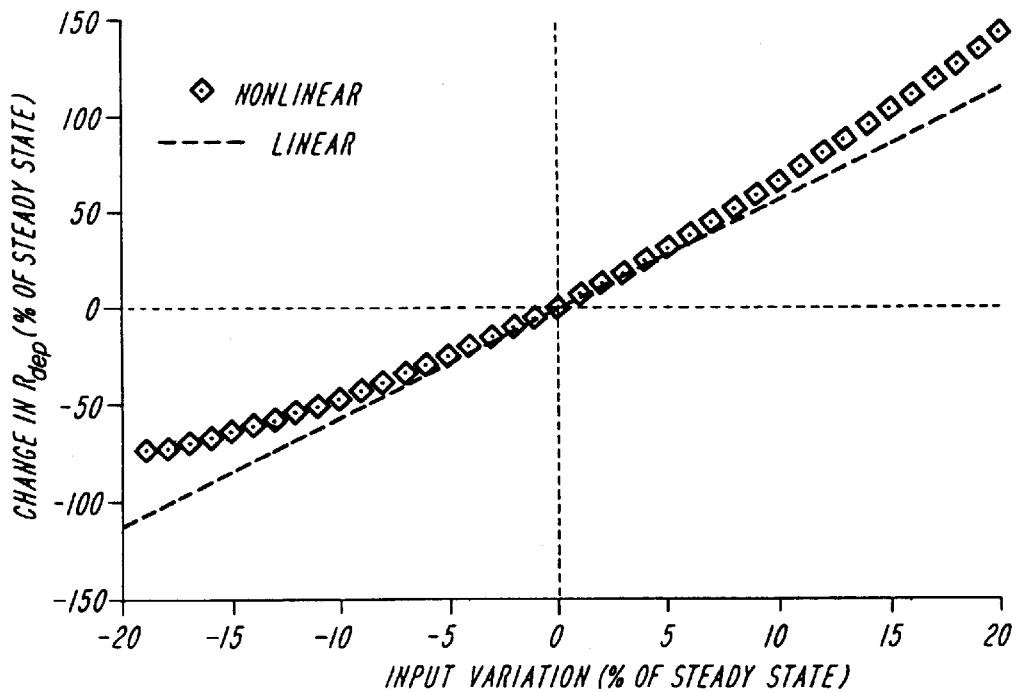
FIGS. 21A and 21B show the comparison of the predictions of the linear and nonlinear models for changes in $P_{heater}$ at 1000K (A) and in $Q_{total}$ at 1300K (B).
Figure 21B:
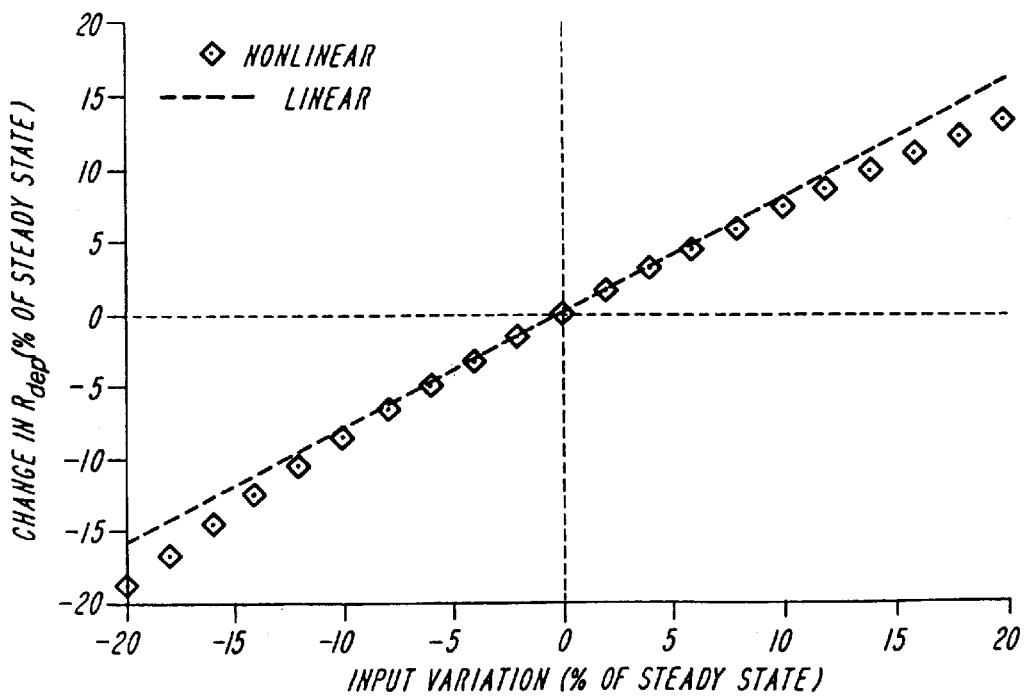

To determine the applicability of such a linear analysis, the steady state deposition rate predicted by the linear and nonlinear models are compared. FIG. 21 A and B plots the largest errors at the two different operating regimes, i.e. heater input power at 1000K and total mass flow at 1300K. No hard nonlinearities or discontinuities are observed nor is any limit cycle behavior present in the dynamic simulations of the nonlinear model. The departure from the linear approximation is larger in the low temperature regime. However, even for the worse case, analysis reveals that a 10% error corresponds to ±10% input power changes and to associated temperature variations of about ±25K. Since this error does not change abruptly, linear frequency analysis can be expected to provide good insight into the design of an appropriate control structure. (Applicability of the linearized model is also supported by the closed-loop system response discussed in Example 3 below, where a linear PI controller is shown to achieve zero steady state error in spite of a 40K temperature variation simulated by the non-linear model.)

The high temperature bode plot (FIG. 20) reveals that at low frequencies the heater power has less relative influence over growth rate, while variations in partial pressure of $TiCl_4$, total mass flow, and total pressure in the reactor have greater impact. The first two of these three inputs have similar bandwidths, while the bandwidth of total pressure is larger. The bandwidth of the heater power input increases with temperature by a factor of about five, as seen in the responses at 1300K and 1000K, due to the increase in radiation heat transfer. Partial pressures of $H_2$, $N_2$, and $TiCl_4$ all have effects of similar magnitude at low temperatures.

Figure 22A:
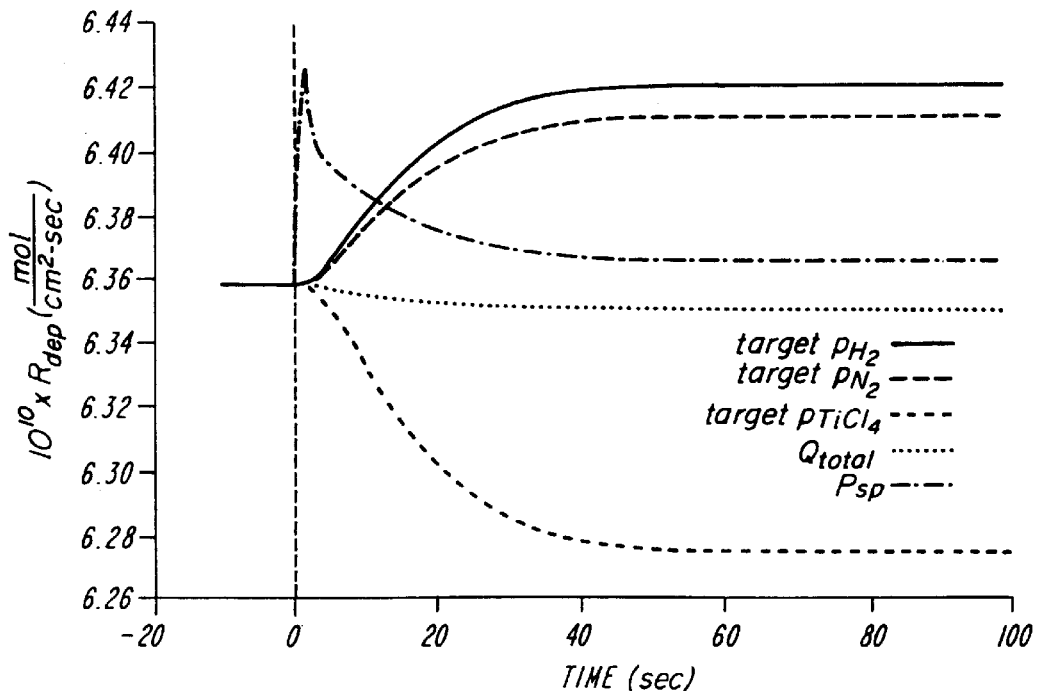
FIG. 22A shows changes in calculated deposition rate caused by +2% steps in different imputs at 1000K.
Figure 22B:
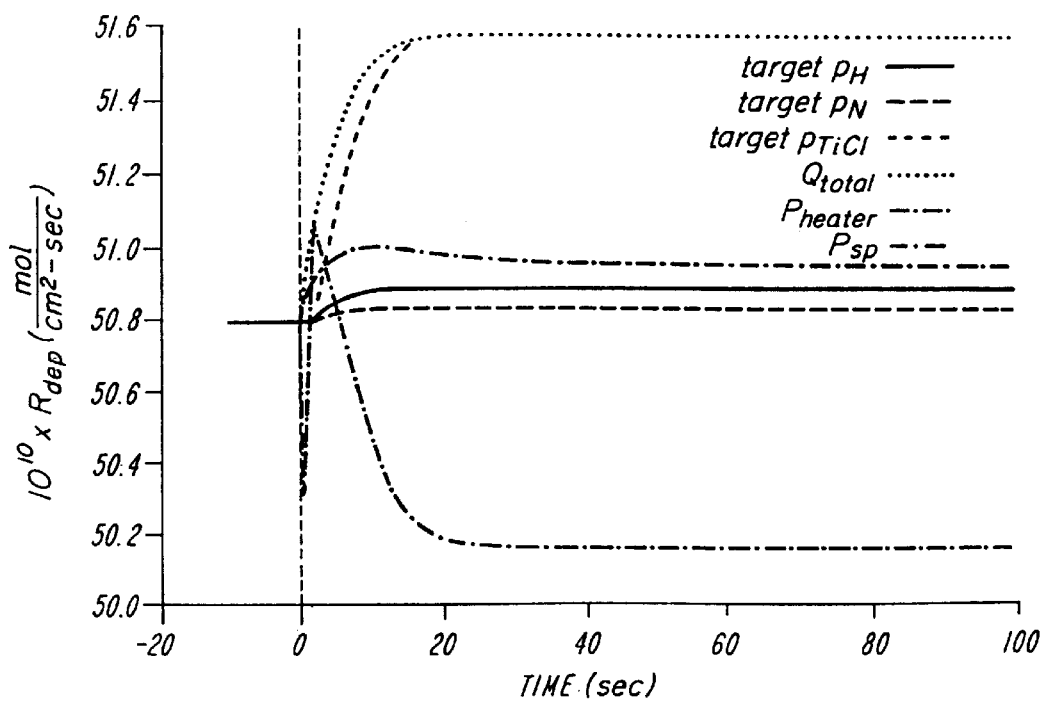
FIG. 22B shows changes in calculated deposition rate caused by +2% steps in different inputs at 1300K.

The dominant features of the Bode plots can be compared to the time responses to changes in each of the inputs. FIGS. 22A and 22B show the response in deposition rate for each input for two temperatures assuming that a pressure control system is used to maintain the chamber pressure even when a flow rate is changed. These results can either be obtained from a model or experimentally and used to determine which input should be selected. Typically, it is desirable to selected those with large gain and that are quick. However, some inputs are characterized by having a right half plane zero who's characteristic signature is that the initial response is in the opposite direction of the final steady-state. Such right half plane zeros can be shown to pose a fundamental limitation on the achievable closed loop performance and should not be selected unless the zero is much faster then the desired closed loop bandwidth. Such a response is seen in FIG. xx for a change in $P_{sp}$.

TABLE 1

Normalized steady state gains obtained the I/Q step response of the nonlinear model.

| input | 1000K | 1100K | 1200K | 1300K |
|---|---|---|---|---|
| $P_{H2}$ | −6.5 db | −6.3 db | −13 db | −20 db |
| $P_{N2}$ | −7.3 db | −10 db | −19 db | −34 db |
| $P\ TiCl_4$ | −4.0 db | −30 db | −5.2 db | −2.0 db |
| $Q_{total}$ | −25 db | −30 db | −7.1 db | −1.9 db |
| $P_{heater}$ | 15 db | 5.8 db | −4.4 db | −15 db |
| $P_{sp}$ | −22 db | −35 db | −8.1 db | −4.6 db |

Steady state incremental input-output gains, calculated from the 2% step responses of the nonlinear model, are shown in Table 1. The Table explicitly reveals how the gain of the actuator varies with operating regime. These numbers correspond to the low frequency gains displayed in the bode plot. Notice the reduced steady state gain displayed by partial pressure of $TiCl_4$ at 1100K. While an increase in the bulk partial pressure of $TiCl_4$ causes a reduction in deposition rate at 1000K, at 1300K deposition rate increases when partial pressure of $TiCl_4$ increases. Thus, the gain associated with partial pressure of $TiCl_4$ shows a sign reversal at intermediate temperatures. This is reflected in the low gain at 1100 K. Physically, this occurs because of variations in the competitive absorption between $TiCl_4$, $N_2$ and $H_2$ with temperature. Lower gains are also displayed by the response to changes in partial pressures of $H_2$ and $N_2$ at higher temperatures. Normalized gains are obtained by dividing the nominal deposition rate at the operating point, and since at 1300K the rate is one order of magnitude larger than at 1000K, there is a 20 db reduction in those normalized gains. Thus, while the relative impact decreases, steps in patrial pressures of $H_2$ and $N_2$ produce larger changes in deposition rate at 1300K than at 1000K.

At higher frequencies and at 1000K the dominant pole for changes in the three mass flow controller (MFC) setpoints is about 0.1 rad/sec, in good agreement with the analysis presented herein and with the time constant observed in the step response of about 15 seconds. At this temperature, response to changes in heater power is slower in both the linearized and the nonlinear system, showing a corner frequency of about 0.03 rad/sec. and a time constant of roughly 40 seconds. The more complex and faster nature of the response to pressure set-point changes is also apparent in both the time and frequency domains.

Based on the above analysis, at 1000K the best actuator (input parameter) for deposition rate (rate of coating growth) would be heater power, since heater power has the strongest influence on deposition rate. The influence of this input, however, is greatly reduced at higher temperatures as the process physics become dominated by mass transport limitations.

At high temperatures more power is radiated to the environment, which is also responsible for the faster response predicted at 1300K. At 1000K, the response to changes in heater power is the slowest of any of the input parameters. Further more, unless active cooling can be performed on the furnace, reducing the temperature will be much more slower than increasing it. Although the sensitivities of deposition rate for changes in total flow and total pressure input parameters are predicted to be high at 1300K, at 1000K they are very small. The partial pressures for nitrogen and hydrogen show the opposite behavior and are more effective at the lower temperatures. In contrast, deposition rate is quite sensitive to the target titanium tetrachloride partial pressure at both 1000K and 1300K, but it is relatively insensitive to variations in this input at 1100K.

Controller designers should also consider the performance limitations of the available sensors. For the chosen control objectives (deposition rate, temperature, and microstructure) several sensor options exist. The design for control of deposition rate assumes that a sensor is available. The sensor technology that is most practical depends on whether one is designing a research or a production scale system. During batch processing, one alternative is to utilize disposable sensors whose electrical characteristics vary with coating thickness.

Example 3

Control of TiN coating microstructure using two independent variables

In the case where deposition rate is unilaterally coupled to temperature (i.e. a change in power will change both temperature and $R_{dep}$, but changes in mass flow will affect $R_{dep}$ but not the temperature), a control structure may be based on the realization that the temperature loop will act as an output disturbance on deposition rate, but there will be no back coupling. Such simplified structure is shown in FIG. 4. Two independent SISO loops are employed to control temperature and $R_{dep}$ independently. Utilizing the closed-loop system from Example 1 for deposition rate control and adding a loop to control temperature allows for the required MIMO control.

Figure 23A:
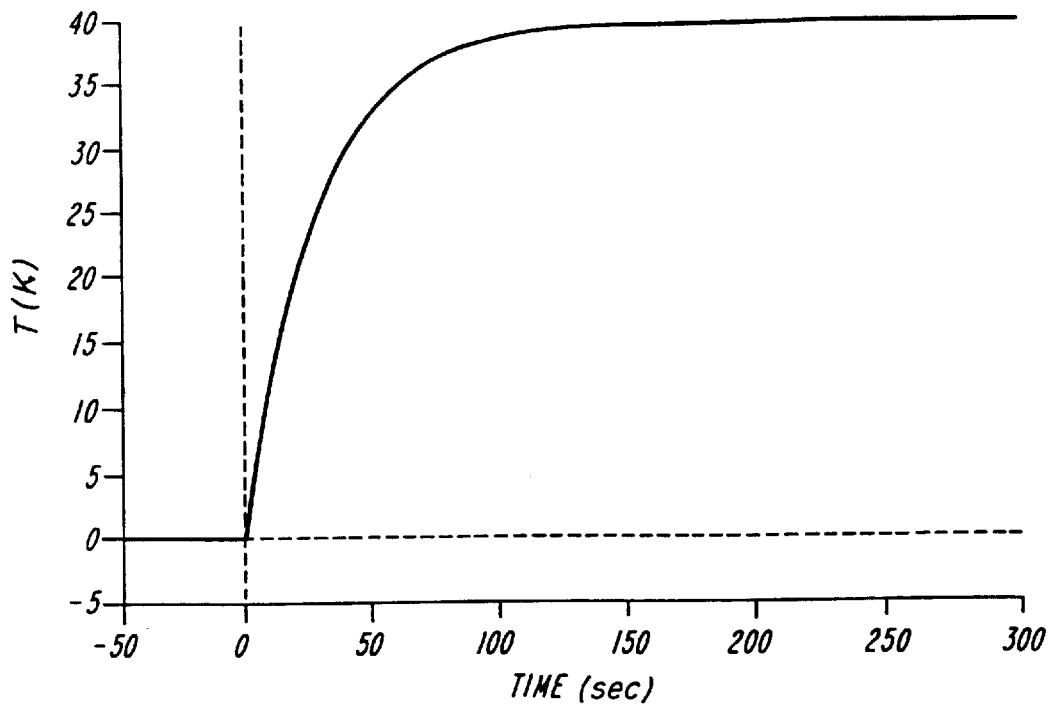
FIGS. 23A and 23B show a closed loop system response in temperature (A) and deposition rate (B) following simultaneous 40 degrees Kelvin increase in T and 10% decrease in $R_{dep}$ for the low temperature regime. The nominal temperature is 1000K.
Figure 23B:
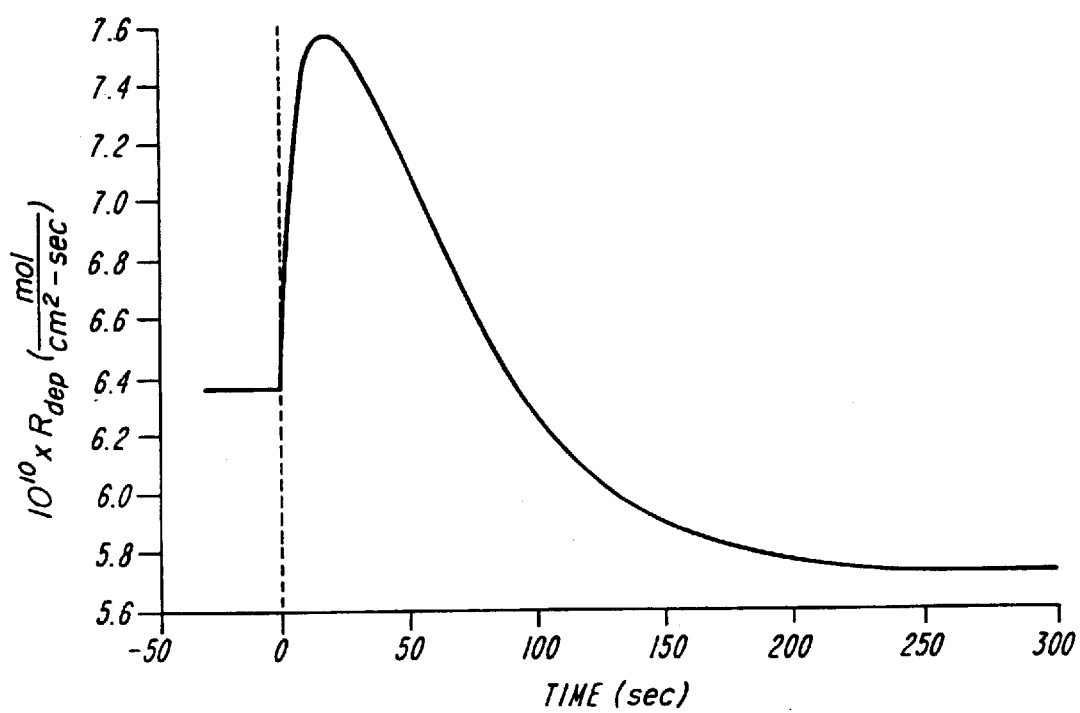

The performance of the proposed control strategy can be illustrated by simulation of temperature and deposition rate behavior for TiN deposition controlled by the closed-loop system, using the nonlinear model at the low temperature operating point (nominal 1000K), which would be the most challenging for the control system. In these simulations, the heater's input power was changed to produce an increase in temperature, and the target $TiCl_4$ partial pressure was adjusted by the rate controller to achieve a reduction in deposition rate. Plots in FIG. 23 A & B show the behavior of temperature and deposition rate for the closed-loop system.

Example 4

Design using a micro-balance to monitor rate.

Figure 24:
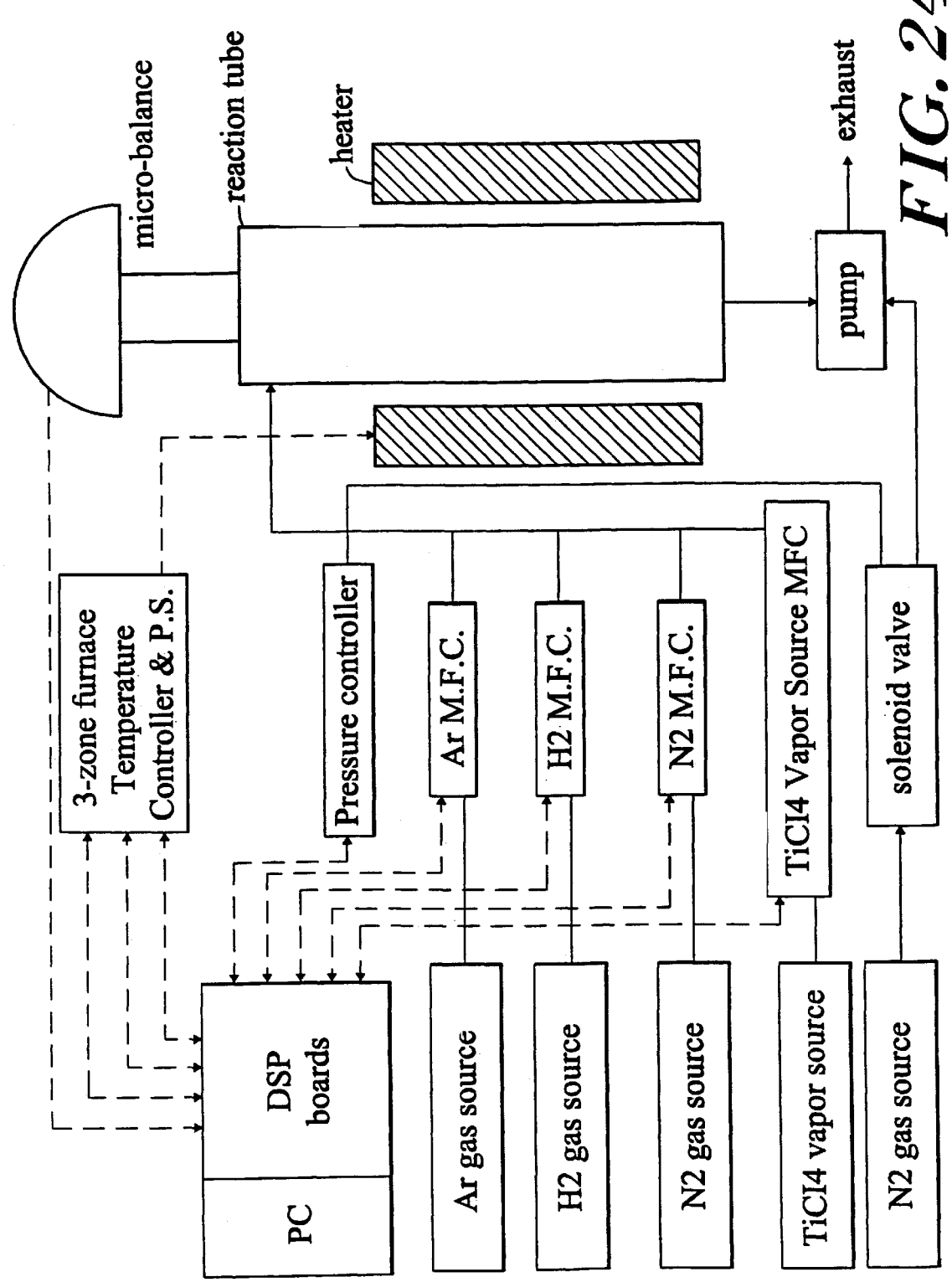
FIG. 24 is a schematic of a CVD system using a microbalance to measure deposition rate.

It is also necessary to consider the interaction between actuator and sensors used to acquire real-time information about the process. One option that may be implemented is the use of a micro-balance to monitor changes in the substrate weight in real-time. A 3-zone hot wall reactor that includes a microbalance to obtain real-time measurements of growth rate is shown in FIG. 24 This system is controlled by three boards, based on Texas Instruments' TMS32OC31 cpu, that are connected to a host PC. This configuration may be used for data acquisition, real-time control and estimation for the system.

The balance is capable of measuring changes in weight as small as $10^{-6}$ grams at a rate of up to one sample per second. The micro-balance was chosen based on its ease of incorporation into a hot wall reactor and its high sensitivity. It will thus be desirable to choose an actuator that minimizes unwanted variations in the detected sample weight. Since the effects of any force applied to the hang-down wire and sample can not be distinguished from a true weight signal, proper consideration of this issue can determine the noise impact. Thus, the micro-balance measurement is very sensitive to changes in the total flow because of the varying forces that they exert on the hang-down wire and sample. The inlet flows of $H_2$, $N_2$ and Ar comprise a large fraction (roughly one third each) of the total inlet flow. Since the total flow is an independent input, one could use the Ar flow to maintain a constant total flow and thus eliminate variations in the apparent sample weight introduced by the use of hydrogen or nitrogen target partial pressures as actuators. However, a significant reduction of the relative influence that these inputs have on deposition rate is observed at high temperatures. In contrast, the inlet flow of $TiCl_4$ is a much smaller fraction of the total flow and is also comparatively efficient at both 1000K and 1300K. This makes partial pressure of $TiCl_4$ an attractive choice as the input parameter. However, the variation of gain magnitude of input is negative at 1000K and positive at 1300K, so different control algorithms would be required, depending on the operating regime. Also at an intermediate temperature (1100K) the gain becomes small so that an alternative actuator would be required. Thus, if it is desired to operate across both regimes, a complex control algorithm would be required.

Another factor that must be taken into account is that, while the manipulable inputs considered so far are a direct mapping of the variables used in steady-state experiments to characterize the process, they are not necessarily the best suited for feedback control. The analysis above shows that requirements imposed by this selection makes the dynamic response more complicated. This was illustrated by the fact that a change in one of the inlet reactant flows requires the opposite change in the carrier gas to keep the total flow constant. Similarly, variations in the pressure set-point must be accompanied with an increase in the inlet gas flows in order to keep the reactant partial pressures and total flow constant. However, independent control of total flow can be very important in minimizing undesirable variations in weight and is inherent in the way inputs have been defined. Therefore the original choice of inputs is preferred for this system.

For purposes of clarity of understanding, the foregoing invention has been described in some detail by way of illustration and example in conjunction with specific embodiments, although other aspects, advantages and modifications will be apparent to those skilled in the art to which the invention pertains. The foregoing description and examples are intended to illustrate, but not limit the scope of the invention. Modifications of the above-described modes for carrying out the invention that are apparent to persons of skill in chemistry, chemical engineering, material science, and/or related fields are intended to be within the scope of the invention, which is limited only by the appended claims.

All patent and other publications mentioned in this specification are indicative of the level of skill of those skilled in the art to which this invention pertains. All such publications and patents are herein incorporated by reference to the same extent as if each individual publication or patent was specifically and individually indicated to be incorporated by reference.

What is claimed is:

1. A method for controlling the application of a surface coating to a substrate by chemical deposition from a gaseous phase, in a reaction chamber containing the gaseous phase, the method comprising the steps of:

comparing a measure of growth rate of the surface coating to a preselected setpoint for desired growth rate of the surface coating to determine a growth rate error signal;

determining a primary corrective input signal from the growth rate error signal wherein the selected primary corrective input signal is selected from the group consisting of (i) mass flow rate into the reaction chamber of a component in the gaseous phase (ii) total mass flow rate into the reaction chamber, (iii) total pressure in the reaction chamber, (iv) heating power input into the reaction chamber, (v) intensity of radiation input into the reaction chamber, (vi) and energy level of radiation input into the reaction chamber, wherein the selected primary corrective input signal has the largest ratio of gain-to-time constant in the group for change in growth rate of the surface coating in response to change in the input parameter; and adjusting the deposition process based on the selected primary corrective input signal to reduce the magnitude of the growth rate error signal.

2. The method for controlling the application of a surface coating to a substrate by chemical deposition according to claim 1, further comprising:

comparing a measurement of temperature of the surface coating to a preselected setpoint for temperature of the surface coating to determine a surface temperature error signal;

determining a second corrective input signal from the surface temperature error signal; and adjusting a second input parameter based on the second corrective input signal, the second input parameter being selected from the group consisting of heating power input into the reaction chamber, total mass flow rate into the reaction chamber, mass flow rate into the reaction chamber of a component in the gaseous phase, total pressure in the reaction chamber, intensity of radiation input into the reaction chamber, and energy level of radiation input into the reaction chamber, wherein the second input parameter is different from the primary input parameter.

3. The method for controlling the application of a surface coating to a substrate by chemical deposition according to claim 2, wherein the second input parameter is heating power input into the reaction chamber, heating power being power applied to a resistance heater or power applied to an induction heater.

4. The method for controlling the application of a surface coating to a substrate by chemical deposition according to claim 2 or claim 3, wherein either the primary input parameter or the second input parameter is intensity of radiation input into the reaction chamber or energy level of radiation input into the reaction chamber, the radiation input being supplied by a laser beam directed into the reaction chamber.

5. The method for controlling the application of a surface coating to a substrate by chemical deposition according to claim 2, wherein the second input parameter has the largest ratio of gain to time constant for change in temperature of the surface coating, gain for temperature of the surface coating being alteration in temperature resulting from a proportional change in the input parameter.

6. The method for controlling the application of a surface coating to a substrate by chemical deposition according to claim 2, further comprising:
    comparing a measurement of coating microstructure to a preselected setpoint for measurement of coating microstructure to determine a microstructure error signal;
    determining a third corrective input signal from the microstructure error signal; and
    adjusting the preselected setpoint for desired growth rate of the surface coating and the preselected setpoint for temperature of the surface coating based on the third corrective input signal.

7. The method for controlling the application of a surface coating to a substrate by chemical deposition according to claim 1, wherein the primary input parameter is mass flow rate into the reaction chamber of a component in the gaseous phase, said method further comprising
    maintaining total mass flow rate into the reaction chamber by equal and opposite adjustment of the mass flow rate into the reaction chamber of a ballast gas to compensate for adjustment in the primary input parameter.

8. A method of controlling the application of a surface coating to a substrate by chemical deposition from a gaseous phase, in a reaction chamber containing the gaseous phase, the method comprising the steps of:
    comparing a measurement of growth rate of the surface coating to a preselected setpoint for desired growth rate of the surface coating to determine a growth rate error signal;
    comparing a measure of temperature of the surface coating to a preselected setpoint for temperature of the surface coating to determine a surface temperature error signal;
    determining a first corrective input signal and a second corrective input signal from both the growth rate error signal and the surface temperature error signal; and
    adjusting a first input parameter based on the first corrective input signal, and adjusting a second input parameter based on the second corrective input signal, the first input parameter and the second input parameter each being selected from the group consisting of (i) mass flow rate into the reaction chamber of a component in the gaseous phase, (ii) total mass flow rate into the reaction chamber, (iii) total pressure in the reaction chamber, (iv) heating power input into the reaction chamber, (v) intensity of radiation input into the reaction chamber, (vi) and energy level of radiation input into the reaction chamber,
    wherein the second input parameter is different from the first input parameter, and first input parameter has the largest ratio of gain-to-time constant in the group for change in growth rate of the surface coating in response to change in the input parameter.

9. The method for controlling the application of a surface coating to a substrate by chemical deposition according to claim 8, wherein the second input parameter has the largest ratio of gain to time constant for change in temperature of the surface coating, gain for temperature of the surface coating being alteration in temperature resulting from a proportional change in the input parameter.

10. The method for controlling the application of a surface coating to a substrate by chemical deposition according to claim 8, further comprising:
    comparing a measurement of coating microstructure to a preselected setpoint for measurement of coating microstructure to determine a microstructure error signal;
    determining a third corrective input signal from the microstructure error signal; and
    adjusting the preselected setpoint for desired growth rate of the surface coating and the preselected setpoint for temperature of the surface coating based on the third corrective input signal.

11. The method for controlling the application of a surface coating to a substrate by chemical deposition according to claim 8, wherein the second input parameter is heating power input into the reaction chamber, heating power being power applied to a resistance heater or power applied to an induction heater.

12. The method for controlling the application of a surface coating to a substrate by chemical deposition according to claim 8, wherein either the first input parameter or the second input parameter is intensity of radiation input into the reaction chamber or energy level of radiation input into the reaction chamber, the radiation being supplied by a laser beam directed into the reaction chamber.

13. A method for applying a surface coating to a substrate by chemical deposition from a gaseous phase, in a reaction chamber containing the gaseous phase, the method comprising controlling the chemical deposition by:
    comparing a measurement of growth rate of the surface coating to a preselected setpoint for desired growth rate of the surface coating to determine a growth rate error signal;
    determining a primary corrective input signal from the growth rate error signal; and
    adjusting a primary input parameter based on the primary corrective input signal, the primary input parameter being selected from the group consisting of mass flow rate into the reaction chamber of a component in the gaseous phase, total mass flow rate into the reaction chamber, total pressure in the reaction chamber, heating power input into the reaction chamber, intensity of radiation input into the reaction chamber, and energy level of radiation input into the reaction chamber,
    wherein thickness of the coating is monitored and, responsive to change in thickness of the coating, coating composition is changed by adjusting one or more parameters selected from the group consisting of mass flow rate into the reaction chamber of a component in the gaseous phase, total mass flow rate into the reaction chamber, total pressure in the reaction chamber, heating power input into the reaction chamber, intensity of radiation input into the reaction chamber, and energy level of radiation input into the reaction chamber.

14. The method for applying a surface coating to a substrate by chemical deposition from a gaseous phase according to claim 13, further wherein composition of the gaseous phase is monitored and one or more parameters selected from the group consisting of mass flow rate into the reaction chamber of a component in the gaseous phase, total mass flow rate into the reaction chamber, total pressure in the reaction chamber, heating power input into the reaction chamber, intensity of radiation input into the reaction chamber, and energy level of radiation input into the reaction chamber, is adjusted in response to thickness of the coating and a measurement of composition of the gaseous phase.

* * * * *